United States Patent [19]

Whetsel

[11] Patent Number: 5,610,826

[45] Date of Patent: Mar. 11, 1997

[54] ANALOG SIGNAL MONITOR CIRCUIT AND METHOD

[75] Inventor: Lee D. Whetsel, Plano, Tex.

[73] Assignee: Texas Instruments Incorporated, Dallas, Tex.

[21] Appl. No.: 242,155

[22] Filed: May 13, 1994

Related U.S. Application Data

[63] Continuation of Ser. No. 693,756, Apr. 30, 1991, abandoned.

[51] Int. Cl.[6] ............................................. G01R 31/3163
[52] U.S. Cl. .................................................... 364/487
[58] Field of Search .................................. 371/22.3, 22.4, 371/22.5, 25.1; 324/73.1, 113; 364/487

[56] References Cited

U.S. PATENT DOCUMENTS

| | | | |
|---|---|---|---|
| 4,340,857 | 7/1982 | Fasang | 371/22.5 |
| 4,441,183 | 4/1984 | Dussault | 371/22.4 |
| 4,524,444 | 6/1985 | Efron et al. | 324/73.1 X |
| 4,634,970 | 1/1987 | Payne et al. | 324/121 R |
| 4,903,022 | 2/1990 | Hester et al. | 341/120 X |
| 4,908,621 | 3/1990 | Pelonio et al. | 341/120 |
| 4,922,492 | 5/1990 | Fasang et al. | 371/22.1 |
| 4,924,468 | 5/1990 | Horak et al. | 371/221 |
| 5,081,592 | 1/1992 | Jenq | 364/487 |
| 5,185,883 | 2/1993 | Ianni et al. | 371/21.2 X |

OTHER PUBLICATIONS

D. Sheingold, ed., *Analog–Digital Conversion Handbook*, Prentice–Hall, 1986, pp. 420–427.
Nicholson, B., "Extending Signature Analysis", *Electronics Industry*, Mar. 1981, pp. 12–16.

*Primary Examiner*—Stephen M. Baker
*Attorney, Agent, or Firm*—B. Peter Barndt; Frederick J. Telecky, Jr.; Richard L. Donaldson

[57] ABSTRACT

An analog signal monitoring (ASM) circuit (40, 42) non-intrusively monitors an analog circuit (20) within an electronic system. The ASM circuit (40,42) comprises input circuitry (80) that receives a plurality of analog signal inputs while the analog circuit (20) operates in a functional mode. Translation circuitry (142) associates with the input circuitry (80) for converting the analog signal inputs into digital signal representations of the analog signal inputs. Output circuitry (58) associates with the translation circuitry to output the digital representations. Control circuitry (114) controls the translation and output circuitry while the analog circuit (20) is in a functional mode. The ASM circuit (40, 42) also include an event qualification circuit (68) that includes input circuitry (236) to receive the digital signal representations, compare circuitry (104) to compare the received digital representations to an expected value and output a matched signal when a compared condition is identified.

23 Claims, 6 Drawing Sheets

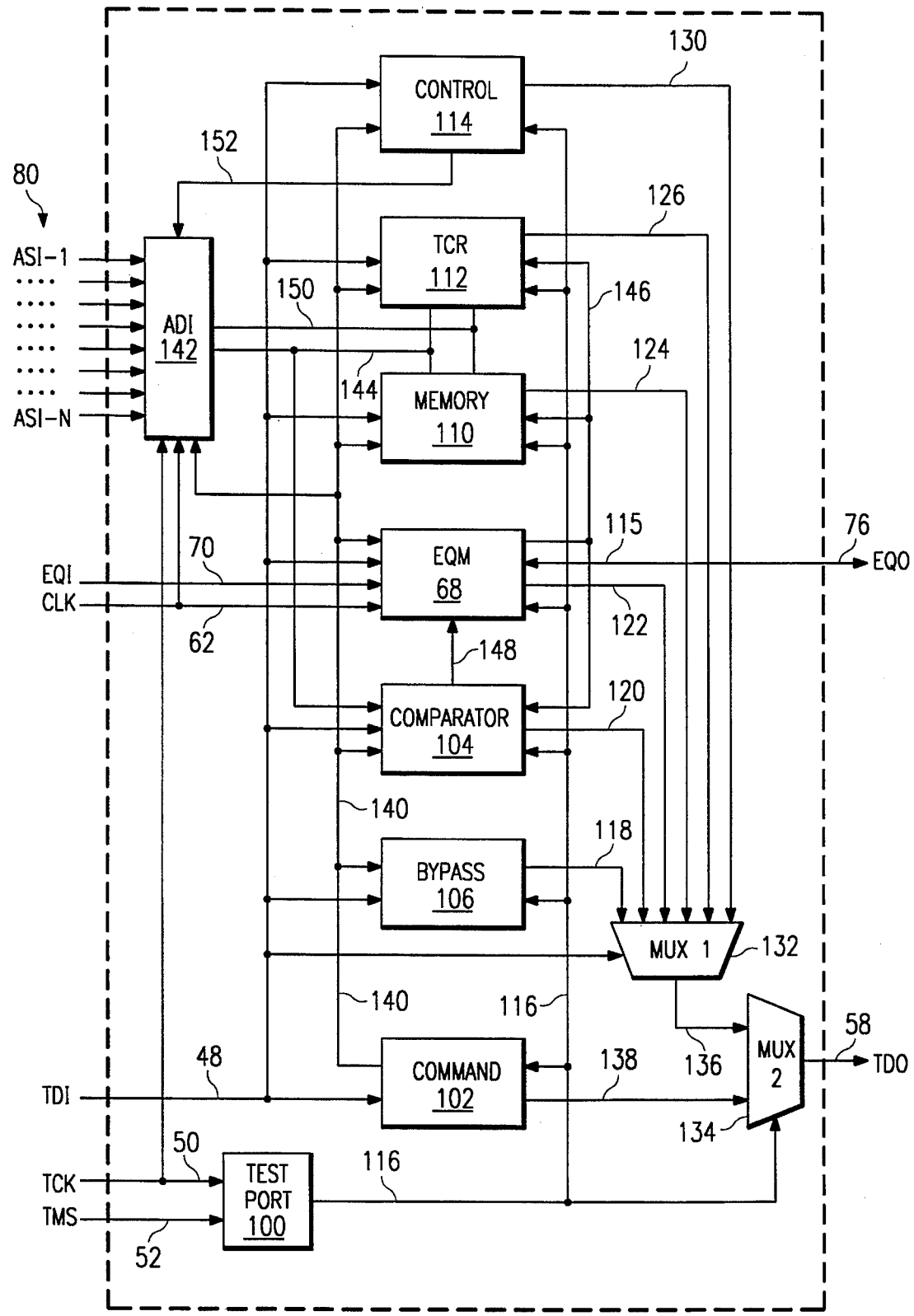

ANALOG SIGNAL MONITOR CIRCUIT AND METHOD

This application is a Continuation of application Ser. No. 07/693,756 filed Apr. 30, 1991, now abandoned.

TECHNICAL FIELD OF THE INVENTION

This invention relates in general to electronic circuits, and more particularly to an analog signal monitor for non-intrusive storing and processing of voltage amplitude measurements on analog signals.

BACKGROUND OF THE INVENTION

Known test methods and systems for measuring and testing analog circuits on electronic circuit boards require the use of expensive external test equipment and signal node probing mechanisms. During test, the analog circuits operate together functionally while an external analog tester probes, stores and processes analog signals within the analog circuit. These external analog test systems do not provide the capability to easily monitor the analog signals while the analog circuitry operates normally in its system environment due to limited physical access to probe the circuit nodes. Moreover, known analog test methods are not easily used during the entire life cycle of a functional circuit, i.e., during production test, system integration, system test, on-line test or diagnostics, and field support and maintenance.

A particular limitation associated with traditional analog test methods is that the state of the art board designs are so densely populated with integrated circuits that physical probing of the analog signals is very difficult, if not impossible. Additionally, in traditional systems the necessity for external probes to make contact with the signal path often affects the analog signal. Probes add resistive and capacitive loads to an analog signal that potentially cause the signal characteristics (e.g., voltage amplitude, and wave shape) to change when these systems take voltage measurements. As a result, physical probing of analog signals can produce inaccurate measurements and distorted test results.

Yet another problem associated with traditional test methods is that these tests are dependent on the systems and availability of external testers and probing fixtures. These systems usually include complex and cumbersome electronic circuits housed within various cabinets or component chassis. In a field environment, the transportation and upkeep of these components can be a very expensive proposition.

U.S. patent application Ser. No. 07/374,896, entitled "Digital Bus Monitor Integrated Circuit," by L. D. Whetsel, the present inventor, filed on Jun. 30, 1989, and assigned to Texas Instruments Incorporated, ("Whetsel") describes a digital bus monitor used to observe data on a box connecting multiple integrated circuits. The monitor of that application comprises a memory buffer, a signature analysis register, a test port and output control circuits controlled by an event qualifying module. In response to a matching condition, the event qualifying module may perform a variety of tests on incoming data while the integrated circuits continue to operate at speed. The invention of that application further includes a plurality of digital bus monitors that may be cascaded for observation and test for variable width data buses and variable width signature analyses.

The digital bus monitor of Whetsel suffers from the limitation that to be useful for testing analog circuits an external analog to digital converter must be connected to the analog circuitry. Additionally, the digital bus monitor of Whetsel suffers from the limitation that it cannot make comparisons in value between a receive signal and a predetermined test value. For example, if the value of hexagonal A5A5 is anticipated from the tested circuitry, unless the received signal is exactly A5A5 the circuit may not respond. In the analog domain, however, it may be important not only that the signal exactly equal a test set point, but more importantly that the relative magnitude between the receive signal and a test set point may be analytically important. For example, if the analog equivalent to hexagonal A5A5 is the predetermined test set point, if the input signal is greater than the analog representation of A5A5, this information may help isolate the source of the signal variance in the analog circuit being tested.

As a result, there is a need for an analog test method and circuit to measure and test analog signals on circuit board designs that does not require the use of expensive external test equipment and signal node probing mechanisms.

There is the need for an analog test method that can effectively test densely populated analog circuit boards for testing.

There is the need for an analog test method that does not rely on the availability of test equipment in a field environment.

Moreover, there is a need for an analog signal testing method and circuit that does not include the resistive and capacitive loads to distort signal characteristics as is common in traditional analog test methods and circuits.

SUMMARY OF THE INVENTION

In accordance with the present invention, an analog signal monitor (ASM) test circuit is provided which substantially eliminates or prevents the disadvantages and problems associated with prior analog test methods and circuits.

The ASM of the present invention may be included in functional circuitry to provide an embedded method of monitoring analog signals generated on or input to the functional circuit. The ASM circuit provides a test methodology that can be used to design built-in test structures at the board level to significantly reduce the need for external testers and probes. The ASM test circuit of a present invention, moreover, provides non-intrusive monitoring of an analog functional circuit while the functional circuit operates in a system. The ASM circuit comprises input circuitry for receiving analog signal inputs. Translation circuitry associates with the input circuitry for converting the analog input signals into representative digital signals. A memory circuit associates with the translation circuitry to store the representative digital signals. Output circuitry associated with the memory circuits outputs the stored representative digital signals. Control circuitry associates with all of the above circuits to control the operation of the input circuit, the translation circuit, the memory circuit, and the output circuit.

A technical advantage of the present invention is its ability for being embedded within the functional circuit board design. This allows the analog signal monitoring circuit to be reused throughout the life cycle of the board, including production test through field service and maintenance. Since the analog signal monitor circuit is part of the board design, its loading effect on the analog signals is always present. This provides more accurate analog measurement that would be possible using an external probing instrument that adds an additional load to the signal being tested, because the load of the external probing instrument is not normally present in the circuit.

Another advantage of the ASM circuit of the present invention is that it avoids the impact on performance of the board circuitry. This because the analog signals being monitored do not have to be routed through the analog signal monitoring circuit, but are only input to it. As a result, no significant signal delay penalty occurs when ASM circuits are used in a system.

Yet another advantage of the present invention is that it provides the ability to measure relationships between actual input signals and test set points, as opposed to simply determining whether the input signal equals the test set point. This may often expedite the isolation of functional circuit abnormalities both during normal operation and when the functional circuit operates in an off-line test mode.

BRIEF DESCRIPTION OF THE DRAWINGS

For a more complete understanding of the present invention and the advantages thereof, reference is now made to the following descriptions taken in conjunction with the accompanying drawings, in which:

FIG. 3. illustrates the architecture of the preferred embodiment of the analog signal monitoring of the present invention;

DETAILED DESCRIPTION OF THE INVENTION

The preferred embodiment of the present invention is best understood by referring to FIGS. 1–9 of the drawings, like numerals being used for like and corresponding parts of the various drawings.

Figure 1:
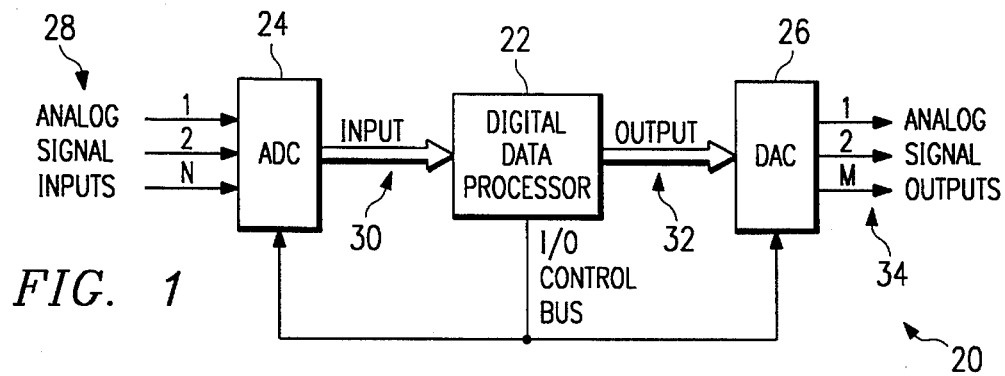
FIG. 1 illustrates a block diagram of an application of the present invention illustrating a generalized circuit consisting of a digital data processor, analog-to-digital converter (ADC), and a digital-to-analog converter (DAC)

FIG. 1 provides an example application of the preferred embodiment showing a generalized circuit 20 consisting of a digital data processor 22, analog-to-digital converter (ADC) 24, and a digital-to-analog converter (DAC) 26. The example illustrates how analog signals 28 can be received and translated into a digital format 30, digitally processed to correct any anomalies, then output 32 for translation back into an analog format and output 34 from circuit 20. The circuit 20 architecture allows analog signals (1, 2, ..., n) 28 to be input into the ADC 24, where they are converted into a digital representation of the voltage level of the received analog signals 28, then input 30 into data processor 22 for processing. After processing, circuit 20 allows the processed analog signals to be digitally output 32 from data processor 22 and into DAC 26. From DAC 26, output signals 32 are converted into an equivalent analog voltage representation and output from circuit 20 via one or more of the analog signal outputs (1, 2, ... m) 34. The operation of ADC 24 and DAC 26 is well known to those skilled in the art of analog and digital design.

The conventional method of testing circuits such as circuit 20 of FIG. 1 to insure proper operation is to probe the input 28 and output 34 analog signals using an oscilloscope or other type of analog measurement device. The loading effect of a probing instrument, however, can cause inaccurate measurements. Also, physical access is required to probe the circuit inputs and outputs. As a result, the circuit must be removed from the system that it supports for probe testing. Removing the circuit from the system disables the system function that the circuit provides.

In most high-end commercial and military applications, systems must remain on line, i.e. fully operational.. These types of systems do not have the opportunity to be taken off line to allow their internal circuits to be accessed for testing purposes. Consequently, the system's internal circuits need to be tested while the system is operating. A need, therefore, has arisen for a method of allowing analog circuits, such as circuit 20 of FIG. 1, to be tested while operating normally in the system that they support. The preferred embodiment provides a methodology and test circuit that allow testing of active analog circuits embedded in a system design.

Figure 2:
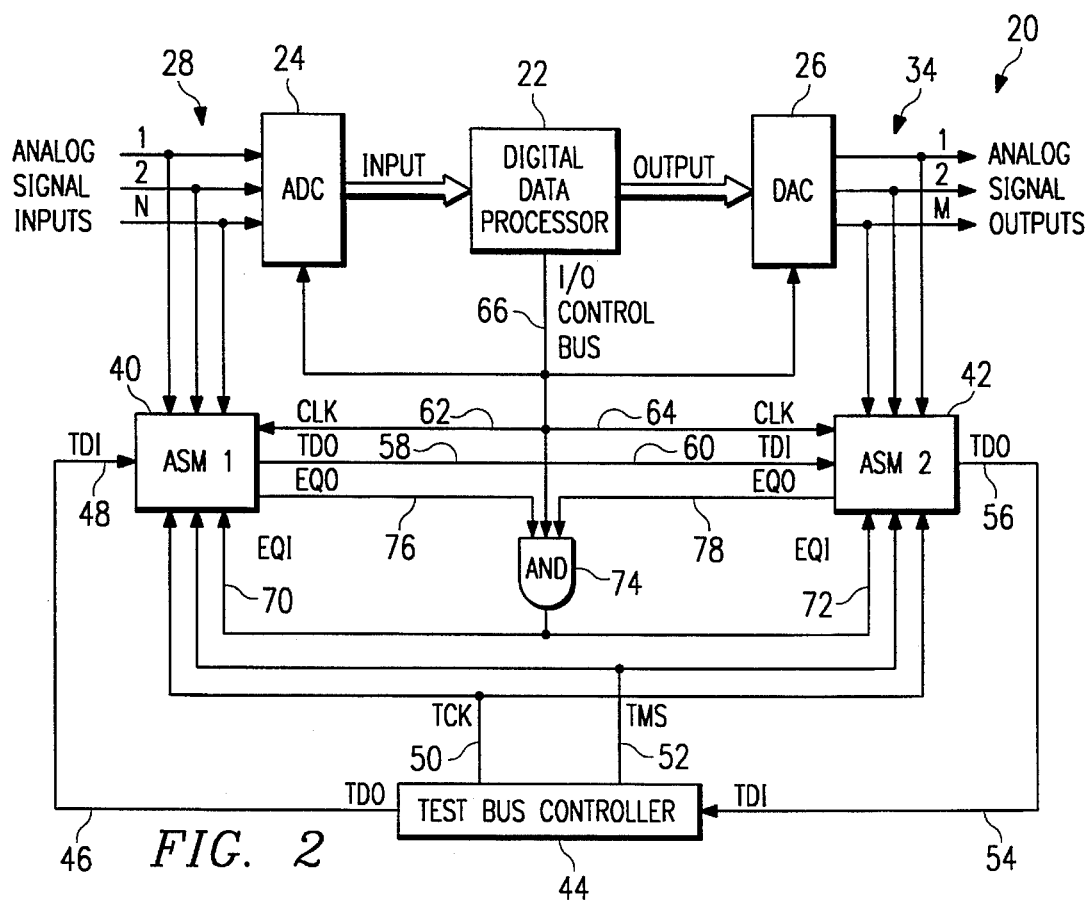
FIG. 2 shows two analog signal monitoring circuits according to the preferred embodiment of the present invention that have been added to the system circuit of FIG. 1 to provide monitoring of the analog input and output signals.

In FIG. 2, two analog signal monitoring (ASM) circuits 40 and 42 have been added to the system circuit 20 of FIG. 1 to provide monitoring of the analog signal inputs 28 and analog signal outputs 34. ASM-1 40 monitors the analog input signals (1, 2, ..., n) 28 to ADC 24 and ASM-2 42 monitors the analog signal outputs (1, 2, ... m) 34 from DAC 26. The ASM circuits 40 and 42 are connected to test bus controller 44 which may either be a local controller in the system circuit 20, a higher level system controller, an external controller that plugs into the system for test access, or a remote controller that connects up to the system via phone lines or electromagnetic transmission.

Test bus controller 44 outputs a test data output (TDO) signal 46 to the test data input (TDI) 48 of ASM-1 40, a test clock (TCK) signal 50 and test mode select (TMS) 52 signal to both ASM circuits 40 and 42, and receives a test data input (TDI) signal 54 from the test data output (TDO) 56 of ASM-2 42. In this configuration, test bus controller 44 can output control on its TMS 52 and TCK 50 signals to cause data to be shifted from the test bus controller TDO output 46, through ASM-1 40 from its TDI input 48 to its TDO output 58, through ASM-2 42 from its TDI input 60 to its TDO output 56, and back into test bus controller 44 via the TDI input 54. Test bus controller 44 uses the scan path through ASM-1 40 and ASM-2 42 to set up test monitor operations on the analog signals entering and leaving circuit 20 and to extract the test results stored in ASM circuits 40 and 42 for processing. The serial bus comprised of TDO, TMS, TCK, and TDI is described in detail in IEEE Standard 1149.1.

The ASM circuits 40 and 42 can receive control signals to execute a test monitoring operation from either test bus controller 44 via the TMS 52 and TCK 50 control signals or from a control circuit internal to each ASM circuit. When the ASMs are controlled by test bus controller 44, they receive control input on the TMS 52 and TCK 50 signals causing them to take a digitized sample of a selected analog signal input 28 and 34. After the digitized analog value(s) is sampled, test bus controller 44 outputs control to shift the data out of the ASM circuits and into test bus controller 44 for processing.

When the ASM circuit is controlled by its internal control circuit, multiple digitized samples of a selected analog input signal can be taken and either stored into an internal RAM memory and/or compressed into an internal signature analysis register. After the digitized analog values are stored and/or compressed, test bus controller 44 outputs control to shift the data or signature out of the ASM and into test bus controller 44 for processing.

An important difference between the two methods of test control, i.e., via test bus controller 44 or the ASM internal control circuit, is that the test performed by test bus controller 44 is asynchronous to the circuit under test, since it receives control from test bus controller 44, while the test performed by the ASM internal control circuit is synchronous to circuit 20, since it receives timing input from circuit 20.

During tests controlled by test bus controller 44, TMS 52 and TCK 50 signals control when digitized analog signal values are captured. The TMS 52 and TCK 50 signals are not synchronous with the operation of circuit 20. While test bus controller 44 is able to sample and shift out an analog measurement, the value shifted out has no relationship to the input or output timing of circuit 20.

When the circuit of FIG. 2 is being monitored using the ASM's internal control circuit, however, the clock (CLK) input 62 and 64 to the respective ASM-1 40 and ASM-42 is driven by the data processor 22 input/output control bus 66. Since the CLK input 62 or 64 drives the internal control circuit, referred to throughout the rest of this disclosure as event qualification module 68 (SEE FIG. 3) or EQM 68, the test is performed synchronous to the operation of circuit 20. In addition to being synchronous to circuit 20, EQM 68 can be qualified so that it knows when to sample an analog signal input 28. Qualification is important because sampling data synchronously, but at random (non-qualified) times, provides meaningless data.

EQM 68 can be qualified to perform a test monitor operation in one of three ways. The digitized analog signal inputs can be matched against being: (1) equal to a stored expected value, (2) greater than a stored expected value, (3) greater than or equal to a stored expected value, (4) less than a stored expected value, (5) less than or equal to a stored expected value, (6) less than or equal to the one stored expected value and greater than or equal to another stored expected value (i.e. within a window bounded by two digital number values), or (7) either greater than one stored expected value or less than another stored expected value (i.e. outside of a window bounded by two digital number values). The first qualification method is for the ASM to receive the analog input from circuit 20, convert it internally into a digital representation, compare the digital representation of the analog signal against a stored expected digital value, and input the compared result into EQM 68 for examination. When a compared signal input to EQM 68 indicates a match condition, EQM 68 outputs control to start storing or compressing the digitized analog signal inputs. After a test is started, EQM 68 can compare against another digitized analog input value to stop the test monitor operation.

The second qualification method is to receive an external digital signal into the event qualification input (EQI) pin 70 and 72 for ASM-1 40 and ASM-2 42, respectively. The EQM 68 can be set up to monitor the EQI pin 70 or 72, as appropriate. The EQI pin 70 or 72 to the ASM-1 40 or ASM-2 42 integrated circuits is driven by AND gate 74. AND gate 74 receives input from input/output control bus 66, and from event qualification output (EQO) pins 76 and 78 of ASM-1 40 and ASM-2 42, respectively. By setting the EQO outputs 76 and 78 to a logic one state, AND gate 74 can pass signals from input/output control bus 66 to EQI input 70 and 72. When a signal from input/output control bus 66 is input to the EQM 68 of each ASM, via the EQI pin 70 and 72, the EQM 68 outputs control to start a test monitor operation. While AND gate 74 is shown receiving input from input/output control bus 66, any number of other external inputs could be input to externally qualify ASM-1 40 and ASM-2 42 to start a test monitor operation. After a first external input starts the test, EQM 68 looks for a second external input to stop the test monitor operation. For clarity, it should be understood that each ASM-1 40 and ASM-2 42 comprises its own separate EQM 68.

The third qualification method involves a combination of the first two methods. To expand the event qualifying capability, EQM 68 inside ASM-1 40 and ASM-2 42 can output a signal indicating when a match is present between a digitized analog input and the stored expected data. When both EQMs 68 in ASM-1 40 and ASM-2 42 arrive at a match, EQMs 68 output a match signal on the respective EQO 76 and EQO 78 outputs. These match signals are combined with external digital signals input to AND gate 74 to produce a global qualification signal that is input to the ASM circuits via EQI inputs 70 and 72. When all inputs to AND gate 74 are high, AND gate 74 outputs a signal into EQI inputs 70 and 72 to start a test monitor operation. The ability to start a test monitor operation in response to a more global qualification input enhances the ASM circuits ability to measure analog signals at precise circuit 20 input/output times. After a first global external input starts the test monitor operation, EQM 68 looks for a second global external signal to stop the test monitor operation.

While AND gate 74 is shown in FIG. 2 as a means of combining external signal inputs into a single signal to be input to EQI input pins 70 and 72, other types of simple boolean functions (e.g., OR, NOR, or NAND) or other more complex boolean functions (e.g., AND-OR, NAND-OR, OR-AND, NOR-AND, etc.) may also be used. In addition, the combining circuit may be designed to allow the qualification inputs to each be individually maskable so that they do not have an effect on the global qualification output signal. The benefit of local masking at the combining circuit inputs is to allow masking of input signals that are not otherwise controllable at their destination points. For example, in FIG. 2, it may be desired to qualify only on the EQO 76 and EQO 78 inputs and not on inputs from the I/O control bus 66, thus the I/O control inputs could be masked locally at AND gate 74. To accomplish this requirement the combining circuit could contain simple masking logic associated with each input that would allow controlling each input independent from the received signal. In addition the combining circuit would need an input and output means to load the input masking control data, such as the serial test bus described in this specification.

The EQM 68 has different modes of operation or protocols allowing it to control a variety of test monitor operations. Only one of its test protocols has been described at this point, i.e., the ability to start and stop a test monitor operation in response to an internal or external signal input. Other EQM 68 operations and protocols may likewise be used. These operations and protocols are described in detail in the following U.S. Patent documents:

| Docket | PTO Reference | Effective Filing Date |
| --- | --- | --- |
| TI-14025 | U.S. Pat. No. 5 103 450 | 02/08/1989 |
| TI-13800 | U.S. Pat. No. 5 001 713 | 02/08/1989 |
| TI-14124 | Ser. No. 07/892 392 | 06/30/1989 |
| TI-15423 | Ser. No. 07/563 579 | 08/06/1990 |
| TI-15433 | U.S. Pat. No. 5 353 308 | 08/06/1990 |
| TI-14996 | Ser. No. 08/082 008 | 03/30/1990 |

FIG. 3 shows the architecture of ASM, such as ASM-1 40 of FIG. 2. The architecture is consistent with the generalized architecture of the Institute of Electrical and Electronics Engineers (IEEE) Standard 1149.1 (IEEE 1149.1) scan architecture for integrated circuits to the extent that it has a four-wire test bus input (TCK 50, TMS 52, TDI 48 and TDO 58) and parallel access to multiple internal scan paths (114, 112, 110, 68, 104, 106, 102). When control is input to test port 100 via TMS 52 and TCK 50 input pins, serial data is shifted from TDI input 48 through either command register 102 or one of the selectable data registers 104, 106, 68, 110, 112, or 114 to TDO output 58.

Test port 100 is an IEEE 1149.1 scan interface circuit that responds to the external test mode select (TMS) 52 or test clock (TCK) 50 input signals to shift data through either command register 102 or one of the selectable data registers 104, 106, 68, 110, 112, or 114 from TDI input 48 to TDO output 58. During scan access, test port 100 outputs control on bus 116 to cause a selected scan path to parallel load with data then shift data from TDI input 48 to TDO output 58. After completing the data shift operation through the selected scan path, test port 100 outputs control on bus 116 to cause the data that has been shifted into the selected scan path to be parallel output from scan path.

Command register 102 is a shift register defined in the IEEE 1149.1 standard that is used to store serial instructions. When selected, command register 102 receives control from test port 100 via bus 116 to shift data from TDI input 48 to TDO output 58. The instruction shifted into command register 102 is used to select one of the data registers serial outputs 118, 120, 122, 124, 126, or 130 to be connected to TDO output 58 via multiplexers 1 132 and multiplexer 2 134. Multiplexer 1 132 provides single input 136 to multiplexer 2 134. Multiplexer 2 134 provides TDO output 58 from either signal 138 from command register 102, or signal 136 from MUX 1 132. When selected, a data register scan path receives control from test port 100 to shift data from TDI 48 to TDO 58. In addition to selecting a data register for scan access, an instruction can be loaded to cause the ASM circuit to operate a test monitor operation.

Bypass register 106 is a single-bit shift register defined in the IEEE 1149.1 standard. When selected via command bus 140 and control bus 116, bypass register 106 couples TDI input 48 up to TDO input 58 through a single shift register stage. The purpose of bypass register 106 is to provide an abbreviated scan path through ASM circuit 40.

Comparator 104 is a circuit used to compare digitized analog values output from the analog-to-digital interface (ADI) 142 against expected data values. Comparator 104 contains memory for storing expected data and mask data values used in comparison operations. Comparator 104 receives input from ADI 142 on bus 144, command bus 140, EQM control bus 146 serial input 48 from TDI and the test port control bus 116. The comparator outputs a compared term (CTERM) 148 to EQM 68 and serial data 120 to TDO output 58.

The EQM 68 is a proprietary Texas Instruments circuit that controls the operation of test cell register (TCR) 112, memory buffer 110, and comparator circuit 104 during analog test monitor operations. The EQM 68 receives input from the external EQI input signal 70, and external clock signal 62, a compare term (CTERM) signal output 148 from comparator 104, command bus 140 serial input from TDI and test port control bus 116. The EQM 68 outputs test control signals to TCR 112, memory buffer 110, and comparator 104 via bus 146, status and compare signals on the external EQO output signal 76, and the serial data 122 to TDO output 58. A detailed description of EQM 68, which is hereby expressly incorporated in by reference, is given in aforementioned U.S. Pat. Nos. 5,103,450 and 5,001,713 as stated above in connection with the description of FIG. 2.

The RAM memory 110 is used to store digitized analog data during test monitor operations. Memory buffer 110 receives input from ADI 142 from buses 144 and 150, command bus 140, EQM control bus 146, serial TDI input 48, and test port control bus 116. The memory buffer 110 outputs serial data 124 to TDO output 58.

Control register 114 is a scan path used to store control bits for ADI 142. Control register 114 receives input from command bus 140, serial input from TDI 48, and from test port control bus 116. The control register outputs control 152 to ADI 142 and serial data 130 to the TDO output 58.

ADI 142 is a circuit used to receive external analog signal inputs 80, convert them into a digital representation and output the digital representation to memory 110, TCR 112, and comparator 104 via buses 144 and 150. The ADI 142 receives external analog inputs 80, control input from command register 102 on bus 140, control input from control register 114 on bus 152, CLK input 62, and TCK input 50.

Multiplexer 1 132 is shown to select one of the serial data outputs 118, 120, 122, 124, 126, 130 from data registers 106, 104, 68, 110, 112 or 114, respectively, to be input to multiplexer 2 134, via signal 136. Multiplexer 1 132 has six serial data inputs as described above, and a selection control input from command bus 140. Multiplexer 2 134 is used to couple the serial data output 138 from command register 102 or output 136 multiplexer 1 132 to the external TDO output 58. Multiplexer 2 134 has one output, the TDO output signal 58. Multiplexer 2 134 has two serial data inputs, input 136 from multiplexer 1 132 and input 138 from the command register 102, and a selection control input from command bus 140.

The ASM circuit 40 TDI input 48 and TDO output 58 pins are arranged to allow a leading device's TDO output to drive the ASM circuit 40 TDI input 48 and a following device's TDI input to be driven by the ASM's TDO output 58. The TCK 50 and TMS 52 input signals are connected in parallel to multiple ASMs or other devices compatible with the IEEE 1149.1 standard test bus interface. FIG. 2 shows an example of this interconnect scheme between two ASMs 40 and 42.

The analog signal inputs (ASI-1 through ASI-n) 80 of ASM 40 in FIG. 3 are connected to analog signals 28 that are to be monitored (see FIG. 2). The ASI signals 80 are input to the ADI 142 where they are converted into a digital representation that can be stored into RAM memory buffer 110 and/or compressed into a signature using the TCR 112. ADI 142 allows measurement and storage of the analog voltage present at a single ASI signal input 80 or the voltage difference between two ASI signal inputs 80.

The ASM circuit 40 CLK input 62 is driven by a system clock source that is synchronous to the operation of the analog circuit and signals being monitored. The CLK signal 62 is input to the EQM 68 and ADI 142 logic blocks. During on-line analog monitoring, EQM 68 will operate synchronous with the CLK 62 input to issue control to TCR 112 and/or memory buffer 110 to store the digitized analog data output from ADI 142.

The ASM circuit 40 EQI input 70 and EQO output 76 pins are coupled to an external combining circuit such as the AND gate 74 of FIG. 2. The external combining circuit allows multiple ASMs and/or other devices that include the event qualification architecture to operate together to qualify and on line test operation.

Analog-to-Digital Interface

Figure 4:
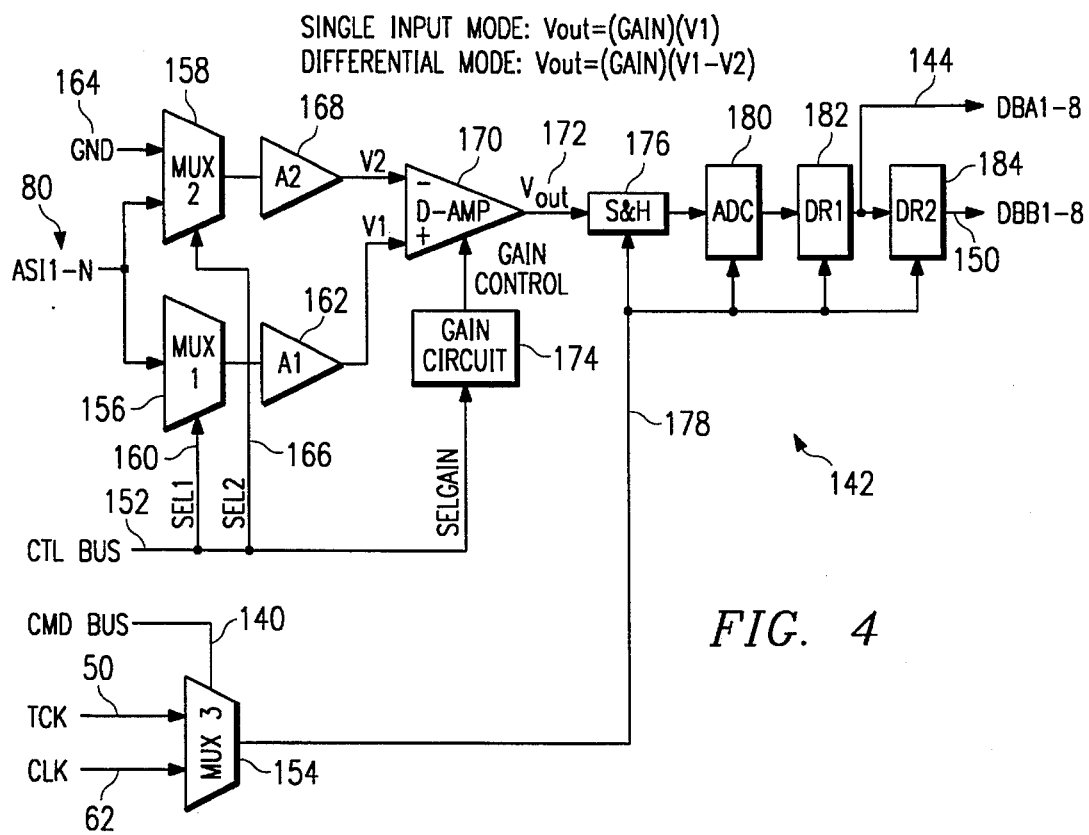
FIG. 4 illustrates a preferred embodiment of the analog-to-digital interface circuit portion of the preferred embodiment of the present invention.

The ADI 142 which FIG. 4 shows converts external analog input signals (ASI-1 through ASI-n) 80 into an equivalent digital representation so that the digitized analog signal value can be stored into the memory 110 and/or TCR 112 in response to control signals from either test port 100 via bus 116 or EQM 68 via bus 146.

Referring to FIG. 4, multiplexer 3 154 couples test clock inputs TCK 50 and CLK 62 to the circuit inside ADI 142. When the test is controlled from test port 100, multiplexer 3 154 receives control from command register 102 via bus 140 to allow the test clock (TCK) 50 to drive the ADI 142 circuits. When the test is controlled from EQM 68, multiplexer 3 154 is controlled to allow the system clock (CLK) 62 to drive the ADI 142 circuits.

Each of the analog multiplexers 156 and 158 permit selecting one of the analog signals (ASI-1 through ASI-n) 80 to be input to ADI 142. Multiplexer 1 156 receives the external analog signals 80 and select control input 160 from control register 114 via bus 152. Multiplexer 1 156 outputs the selected analog signal into a unity gain (1:1) amplifier A1 162. Multiplexer 2 158 receives the external analog inputs 80, a ground reference voltage (0 volts) 164, and selection control input 166 on bus 152. Multiplexer 158 outputs the selected analog signal into a unity gain amplifier A2 168.

The A1 amplifier 162 and A2 amplifier 168 provide a high impedance input to the selected analog signal to minimize the signal loading. The voltage output from A1 (V1) and A2 (V2) is equal to the voltage input, i.e., the amplifiers have a gain of 1. The V1 and V2 outputs of A1 and A2 are input to a differential amplifier (D-AMP) 170.

The D-AMP 170 measures the voltage difference between two analog input signals or the voltage on a single analog signal, and provides a programmable gain capability. The ability to adjust the D-AMP 170 gain, via the programmable gain input, improves the accuracy of very low-level analog voltage measurements. The D-AMP 170 receives V1 and V2 analog signals from amplifier A1 162 and A2 168 gain control from gain circuit 174. The D-AMP and outputs a signal indicating the voltage difference between the two on the $V_{out}$ output 172. The GAIN circuit 174 receives gain setting input from control register 114 via bus 152 and outputs gain control to D-AMP 170 that adjusts the gain of D-AMP output $V_{out}$ 172.

The ability to measure the voltage difference between two analog signals is important in many analog test scenarios. One test scenario for the difference measurement is the ability to measure the voltage drop across a resistor from the resistors' input current node to its output current node. By knowing the voltage drop and the resistance value, the current through the resistor can be derived. An equation representing the output of the D-AMP 170 during difference measurements is $$V_{out}=(V1-V2)\times(GAIN). \tag{1}$$

For example, if V1 is 5 volts and V2 is 2.5 volts and the gain is set for an amplification of 2, the $V_{out}$ signal is equal to, $$V_{out}=(5-2.5)\times(2)=5 \text{ volts}. \tag{2}$$

The ability to measure the voltage on a single analog signal is also important in many analog test scenarios. One test scenario for a single analog signal measurement is the ability to measure the output voltage of a voltage power supply with reference to the electrical ground (GND) 164. By selecting the GND (0 volt) input 164 to Multiplexer 2 158 to be input to the D-AMP 170 at V2, equation (1) changes to allow $V_{out}$ 172 to be equal to only the V1 input times the GAIN setting, i.e., $$V_{out}=(V1)\times(GAIN). \tag{3}$$

For example, if V1 is 2.5 volts and the gain is set for an amplification of 3, $$V_{out}=(2.5)\times(3)=7.5 \text{ volts}. \tag{4}$$

The sample and hold (S&H) circuit 176 samples and holds the analog signal output $V_{out}$ 172 from the D-AMP 170. S&H circuit 176 receives the output signal $V_{out}$ from D-AMP 170 and a clock input 178 from the clock multiplexer 3 154. S&H circuit 176 outputs a sampled voltage level to the analog-to-digital converter (ADC) 180. S&H circuit 176 acts as a capacitor that can instantaneously store the voltage level being input from the D-AMP 170 in response to clock input 178. The voltage level stored and output from the S&H circuit 176 remains constant until the next clock input 178.

The ADC circuit 180 converts the analog signal input from S&H circuit 176 into a digital representation. ADC circuit 180 receives the analog signal output from S&H circuit 176 and a clock input 178 from Multiplexer 3 154. In response to clock input 178, ADC circuit 180 translates the analog signal input from S&H circuit 176 into an equivalent digital value and outputs the digital value to a first digital register (DR1) 182. This analog-to-digital translation process repeats in response to subsequent clock inputs 178.

The DR1 182 provides a storage means for the digitized analog data output from ADC 180. DR1 182 receives the digital output from ADC 180 and a clock input 178 from Multiplexer 3 154. DR1 182 stores data in response to clock input 178. DR1 182 outputs stored data to a second data register (DR2) 184, memory 110, TCR 112, and comparator 104 via data bus A (DBA1-8) 144. DR2 184 provides a storage means for the data output from DR1 182. DR2 184 receives the digital output from DR1 182 and a clock input from Multiplexer 3 154. DR2 184 stores data in response to clock input 178. The DR2 184 outputs stored data to memory 110 and TCR 112 via data bus B (DBB1-8) 150.

During test operations controlled by test port 100, DR1 182 stores the digital output from ADC 180 for one test port clock (TCK) 50 cycle to allow time for TCR 112 and memory 110 to store the data. Test port 100 receives external control input on TCK 50 and TMS 52 pins to cause TCR 112 and memory 110 to store the data output from DR1 182. EQM 68 and comparator 104 are not required for test operations controlled by external control input via test port 100.

During test operations controlled by EQM 68, DR1 182 is used to store the digital output from ADC 180 for one system clock (CLK) 62 cycle to allow time for comparator 104 to match the digital value output from DR1 182 on bus DBA1-8 144 against a stored expected value in comparator 104. If the data from DR1 182 matches with the expected data, the comparator 104 outputs a signal to EQM 68 via the CTERM signal 148 (See FIG. 3). On the next CLK input 62, the match data from DR1 182 is transferred into DR2 184, and EQM 68 responds to the CTERM match signal input 148 and outputs control to TCR 112 and memory 110. On the next CLK input 62, TCR 112 and memory 110 store the "match" data output from DR2 184.

Thus, the purpose of DR2 184 is to store (or "pipeline") the data that matched for one clock cycle after the match to allow the data to be stored in TCR 112 or memory 110. Without DR2 184, the match data would be lost and TCR 180 and memory 110 would start storing the data after the match data. Depending on the type of test being performed, EQM 68 may output control to continue storing, on subsequent CLK inputs 62, the data followed by the "match" data or stop storing data after the "match" data is stored.

Operation of the Analog-to-Digital (ADI) Circuit

When ADI circuit 142 translates an analog signal input 80 into a binary bit representation, each bit position that is set to a logic high logic level is assigned a numerical weight. The most significant binary bit position has the largest numerical weight which is equal to ½ of the maximum voltage input. The least significant bit position has the smallest numerical weight which is equal to $½^n$ of the maximum voltage input, where "n" equals the number of binary bits. Binary bit positions between the most and least significant bit positions are numerically weighted according to their bit position, the more significant the bit position the higher the numerical weight given.

Bit Position v. Weight, Listing For 8-Bit Binary Position
MSB $$\text{Bit } 8 = W_8 = ½^1 = ½$$

$$\text{Bit } 7 = W_7 = ½^2 = ¼$$

$$\text{Bit } 6 = W_6 = ½^3 = ⅛$$

$$\text{Bit } 5 = W_5 = ½^4 = 1/16$$

$$\text{Bit } 4 = W_4 = ½^5 = 1/32$$

$$\text{Bit } 3 = W_3 = ½^6 = 1/64$$

$$\text{Bit } 2 = W_2 = ½^7 = 1/128$$

LSB $$\text{Bit } 1 = W_1 = ½^8 = 1/256 \qquad (5)$$

For example, bits 1 through 8 are shown below along with their numerical weighing $W_1, W_2, \ldots W_8$. Bit 8 is the most significant and carries the most weight (½), and Bit 1 is the least significant and carries the least weight (1/256).

The following equation states that the sum of the weights (1–j) of the binary bit positions (W) that are set to a logic high level ($C_i$) is multiplied by the maximum voltage ($V_{mx}$) to determine the magnitude of the digitized analog voltage input signal:

$$\text{Digitized Analog Voltage} = V_{mx} \Sigma^j_{i=1} C_i W_i = V_{mx}[C_1 W_1 + C_2 W_2 + \ldots + C_8 W_8] \qquad (6)$$

It is important to note that the bit position's weight ($W_i$) is summed only if the bit ($C_j$) is set to a high logic level.

The following eight bit binary patterns represent corresponding analog voltage levels between 0 volts (minimum) and 10 volts (maximum) as determined by the bit position weights that are set to high logic levels. The weight given to a particular bit position (Wi) in the binary patterns below is obtained from the bit position vs weight listing above.

MSB LSB

BBBBBBBB 8 7 6 5 4 3 2 1

0 0 0 0 0 0 0 0=[0]×10 Volts=0 Volts 0 0 0 0 0 0 0 1=[$W_1$]×10 Volts=0.039 Volts 0 0 0 0 0 0 1 0=[$W_2$]×10 Volts=0.078 Volts 0 0 0 0 0 1 0 0=[$W_3$]×10 Volts=0.156 Volts 0 0 0 0 1 0 0 0=[$W_4$]×10 Volts=0.312 Volts 0 0 0 1 0 0 0 0=[$W_5$]×10 Volts=0.625 Volts 0 0 1 0 0 0 0 0=[$W_6$]×10 Volts=1.25 Volts 0 1 0 0 0 0 0 0=[$W_7$]×10 Volts=2.5 Volts 1 0 0 0 0 0 0 0=[$W_8$]×10 Volts=5.0 Volts 1 0 0 0 0 0 0 1=[$W_1+W_8$]×10 Volts=5.039 Volts 1 0 0 0 0 0 1 1=[$W_2+W_8$]×10 Volts=5.078 Volts 1 0 0 0 0 0 1 1=[$W_1+W_2+W_8$]×10 Volts=5.117 Volts

. . . . . . . .

. . . . . . . .

. . . . . . . .

1 1 1 1 1 1 1 1=[$W_1+W_2+\ldots+W_8$]×10 Volts=10 Volts

In the above example of a binary-weighted digital pattern, the resolution of the analog measurement is determined by the weight of the least significant bit. The weight of the least significant bit, in turn, is determined by the width of the binary bit pattern. For the 8-bit pattern shown above, the resolution is determined by the weight given to bit position 1, which is $W_1$ above, or 1/256. For a 7-bit pattern, the resolution is the weight given to bit position 2, which is $W_2$ above, or 1/128. For a 6-bit pattern, the resolution is the weight given to bit position 3, $W_3$ above, or 1/64.

Memory Buffer

Figure 5:
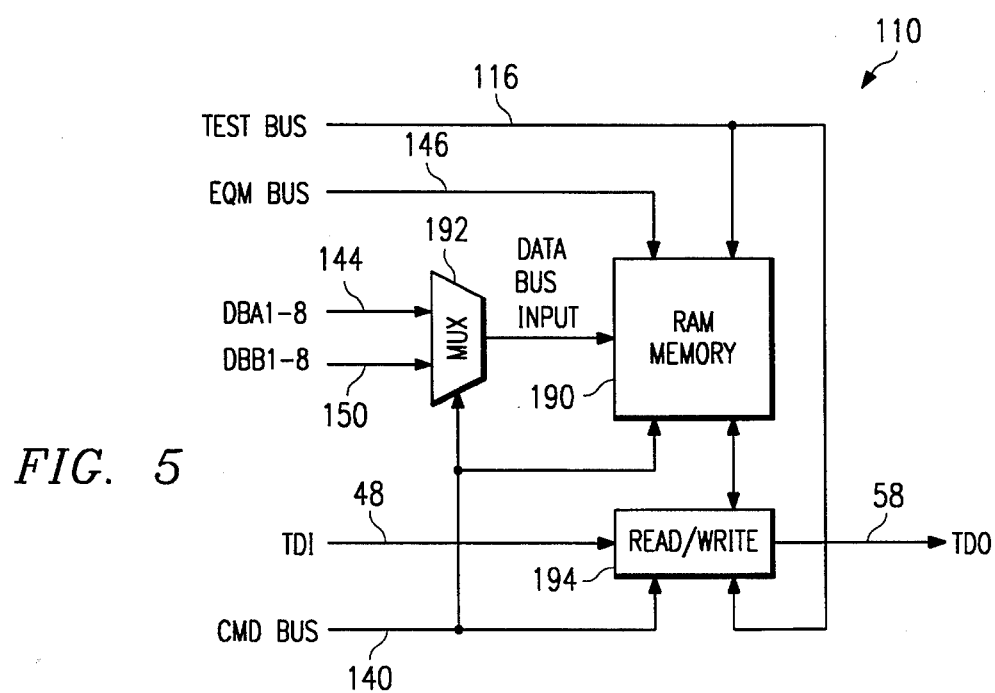
FIG. 5 illustrates a preferred embodiment of the memory circuit portion of the preferred embodiment of the present invention.

FIG. 5 shows memory circuit 110, which is used to store the digitized analog data output from ADI 142 on buses DBA1-8 144 and DBB1-8 150. Memory circuit 110 consists of read/write memory 190, data bus multiplexer 192, and scan path 194.

RAM memory 190 stores the digitized analog inputs from ADI 142. Memory 190 receives parallel data input from data bus multiplexer 192, control input from command register 102 via bus 140, control input from EQM 68 via bus 146, control input from test port 100 via bus 116, and parallel data input from scan path 194. Memory 190 outputs parallel data to the scan path 194.

Data bus multiplexer 192 provides selection of the data bus input to the memory 190. The data bus multiplexer 192 receives the DBA1-8 data bus input 144 and DBB1-8 data bus input 150 from ADI 142, and control input from command register 102 via bus 140. The data bus multiplexer 192 outputs parallel data to memory 190.

Scan path 194 allows serial reading and writing of parallel data to and from memory 190 via test port 100. Scan path 194 receives serial input from TDI input pin 48, parallel input from memory 190, and control input from test port 100 via bus 116. Scan path 194 outputs serial data to TDO output pin 58 and parallel data to memory 190.

When test port 100 controls the test monitoring operation, data bus multiplexer 192 receives control from command register 102 via bus 140 to select DBA1-8 144 to be input and stored in memory 190. The data is stored into memory 190 when the memory 190 receives control input from test port 100 control bus 116.

When the test is controlled from EQM 68, the data bus multiplexer receives control from the command register via bus 140 to select DBB1-8 150 to be input and stored in the memory 190. The data is stored into memory 190 when the memory 190 receives control input from the EQM control bus 146.

After a test monitoring operation, the contents of memory 190 may be read out of ASM 40 by the scan path 194. During scan out operations, scan path 194 and memory 190 receive control from test port 100 to allow the memory 190 to parallel load data into the scan path 194 to be shifted out for inspection.

Test Cell Register

Figure 6:
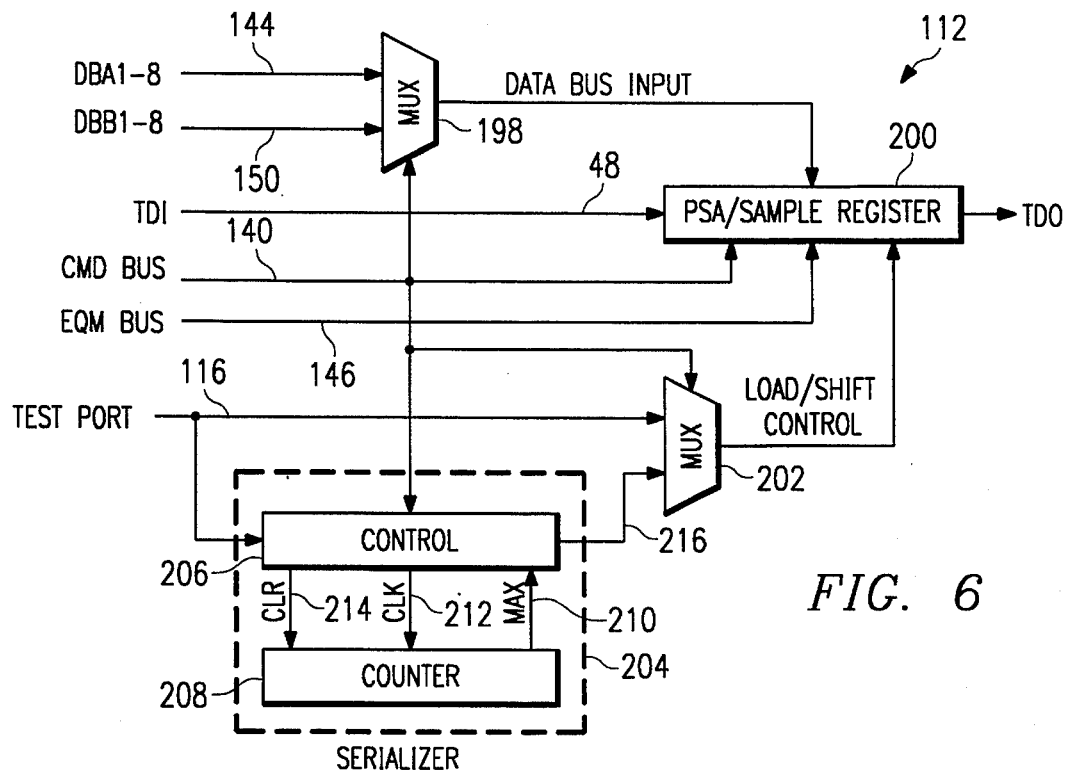
FIG. 6 shows the preferred embodiment of the test cell registers, portion of the preferred embodiment of the present invention.

FIG. 6 shows TCR circuit 112 which is used to capture and compress digitized analog data output from ADI 142 on buses DBA1-8 144 or DBB1-8 150. The TCR circuit 112 consists of data bus multiplexer 198, a scannable parallel signature analysis (hereinafter "PSA") PSA/Sample register 200, load/shift control multiplexer 202, and serializer 204 which comprises control circuit 206 and counter 208.

Data bus multiplexer 198 allows selecting which parallel data bus output 144 or 150 from the ADI 142 is input to PSA/Sample register 200. Data bus multiplexer 198 receives DBA1-8 data bus input 144 and DBB1-8 data bus input 150 from ADI 142, and control input from command register 102 via bus 140. Data bus multiplexer 198 outputs parallel data to PSA/Sample register 200.

PSA/Sample register 200 allows sampling a single parallel data input or compressing multiple parallel data inputs into a signature using a parallel signature analysis technique. PSA/Sample register 200 receives serial data input from the ASM TDI pin 48, parallel data input from data bus multiplexer 198, control input from command register 102 via bus 140, control input from load/shift control multiplexer 202, and control input from EQM 68 via bus 146. PSA/Sample register 200 outputs serial data to the ASM TDO pin 58.

The load/shift control multiplexer 202 allows either the load/shift control output from test port 100 or the load/shift control output from the serializer 204 to be input to PSA/Sample register 200. The load/shift control multiplexer 202 receives selection control input from command register 102 via bus 140, load/shift control input from test port 100 via bus 116, and load/shift control input from serializer 204. The load/shift multiplexer 202 outputs load/shift control to PSA/Sample register 200.

Serializer 204 permits repeating the steps of: (1) parallel loading data from data bus multiplexer 198 into PSA/Sample register 200, (2) shifting out the data loaded in PSA/Sample register 200 for a predetermined number of bit-shift operations, and (3) repeating steps (1) and (2) while test port 100 outputs control to shift data out of ASM 40. The loading process occurs in such a way as not to inhibit the shifting process. Serializer 202 consists of control circuit 206 for loading data into and shifting data out of PSA/Sample 200 and counter circuit 208 for counting the number of bit-shift operations performed in PSA/Sample register 200.

Serializer control circuit 206 receives control input from command register 102 via bus 140, control input from test port 100 via bus 116, and a maximum count (MAX) signal 210 from counter 208. Control circuit 206 outputs clock (CLK) 212 and clear (CLR) 214 signals to counter 208 and load/shift control 216 to load/shift control multiplexer 202. Counter circuit 208 outputs a maximum count (MAX) 210 signal to control circuit 206 and receives CLK 212 and CLR 214 signals from control circuit 206.

When test port 100 controls the PSA, sample, or serialize test, data bus multiplexer 198 receives control from command register 102 via bus 140 to select DBA1-8 144 to be input to the PSA/Sample register 200. The data is sampled or compressed into a signature by PSA/Sample register 200 when it receives control input from test port control bus 116.

When EQM 68 controls the PSA or sample test, data bus multiplexer 198 receives control from command register 102 via bus 140 to select DBB1-8 150 to be input to PSA/Sample register 200. PSA/Sample register 200 samples or compresses the data when it receives control input from EQM 68 via control bus 146.

During PSA operations, a predetermined number of parallel data inputs from the data bus multiplexer 198 are clocked into PSA/Sample register 200. Each parallel data input clocked into PSA/Sample register 200 combines with the pre-existing contents of PSA/Sample register 200. PSA/Sample register 200 also stores the result of this combining operation. At the end of the PSA operation, the data pattern stored in PSA/Sample register 200 is known as the "signature" of all the parallel data inputs clocked into PSA/Sample register 200. The signature value will always be the same if the PSA/Sample register 200 is initially set to a predetermined first data value, referred to as the "seed value", and the same known sequence of parallel data inputs are clocked into PSA/Sample register 200.

After a PSA or Sample test operation, PSA/Sample register 200 can receive control from command register 102 and test port 100 to shift the data sampled or the signature compressed out of ASM 40 for inspection. If the inspection finds that the sampled data or the signature matches an expected value the test passed, otherwise it fails.

Advantages of the Serializer

Figure 9:
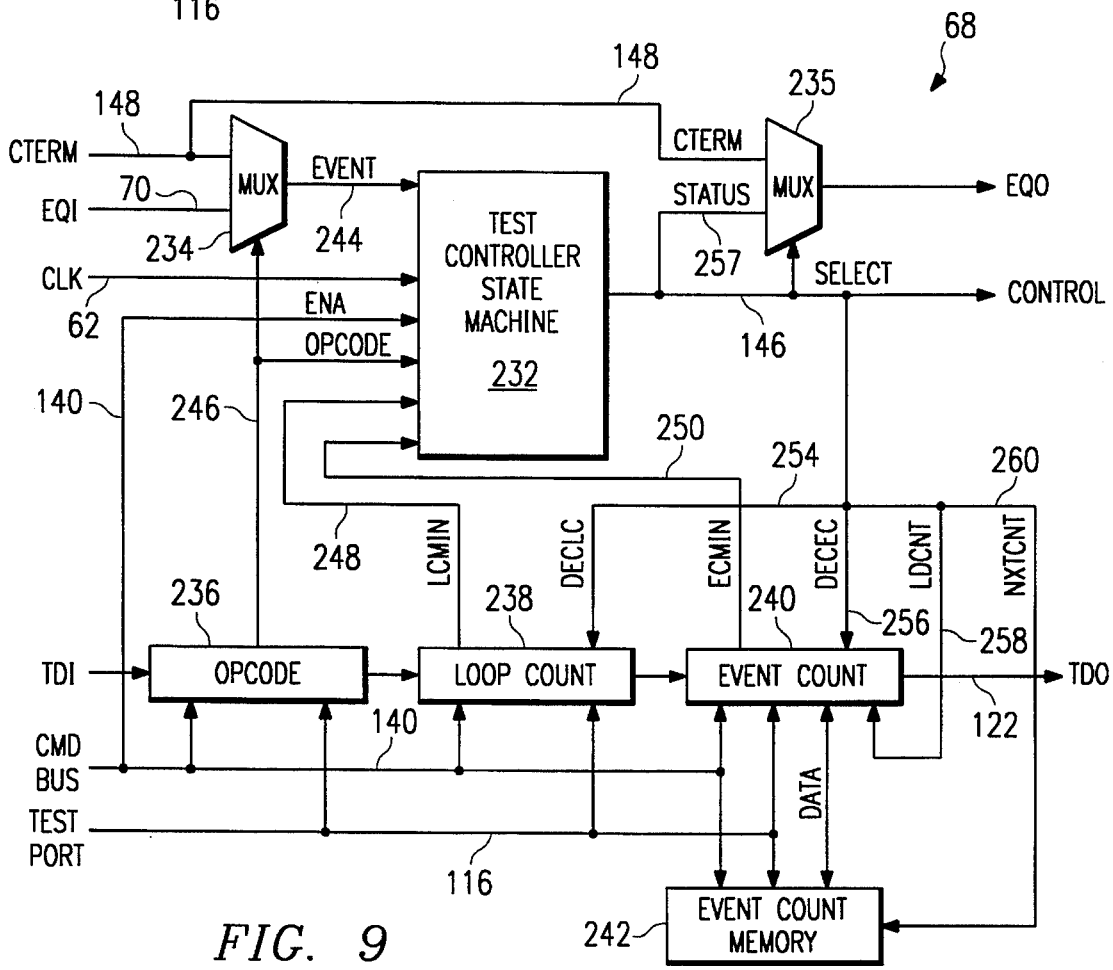
FIG. 9 shows the event qualification module of the preferred embodiment of the present invention.

The advantage of serializer 204 include its ability to repetitively load and shift out multiple digitized analog input signals during one IEEE 1149.1 data scan shift cycle. This increases the output rate of the digitized analog data. FIG. 9 illustrates the IEEE 1149.1 test port state diagram. The state diagram defines the scan cycle for accessing a device's instruction or data register. The following description illustrates the speed advantage gained by using serializer 204 to output multiple digitized analog data packets during one IEEE 1149.1 scan cycle, instead of outputting the data packets one at a time using multiple IEEE 1149.1 scan cycles. Aformentioned document TI-14996 provides a detailed description of this technique, as it applies to reading and writing digital memory elements. The details of that afoementioned document TI-14996 are herein incorporated by reference.

Figure 7:
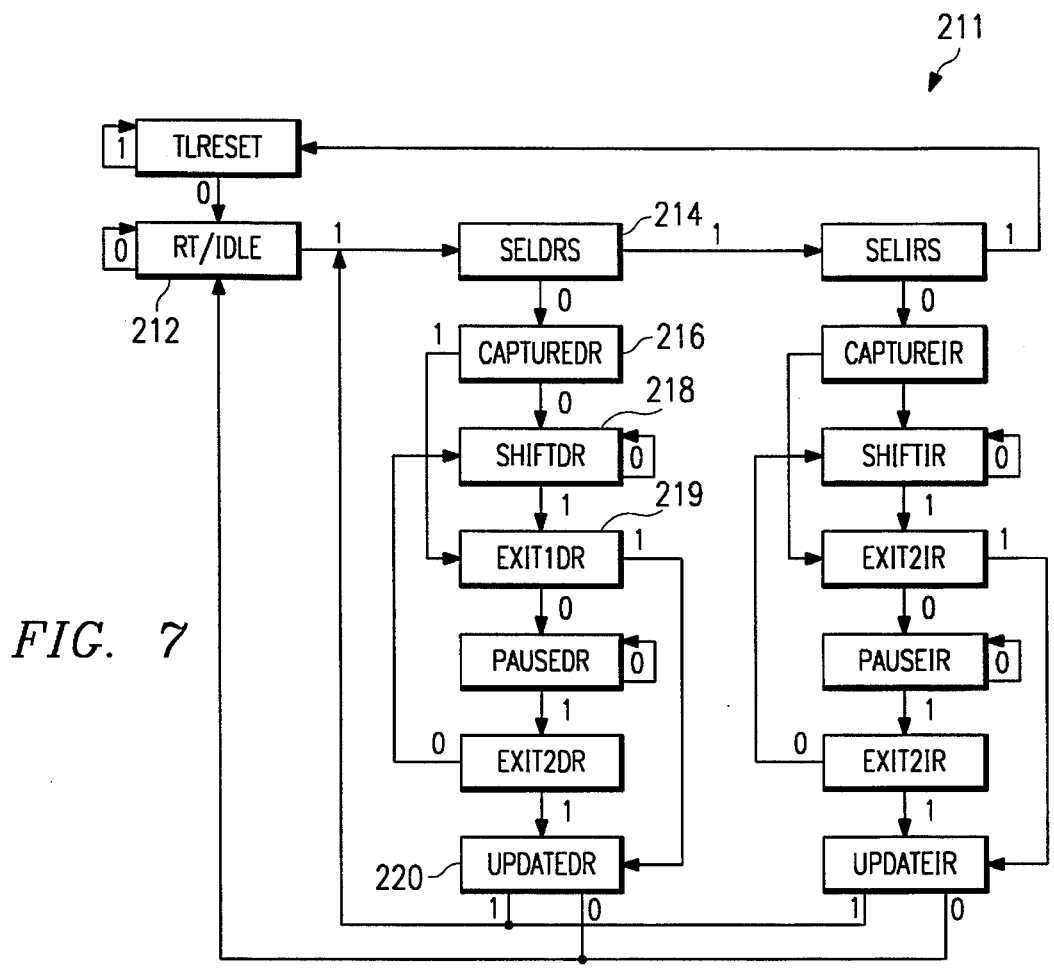
FIG. 7 provides an illustrative state diagram of the test port according to IEEE 1149.1 specification used in the preferred embodiment of the present invention.

Referring to FIG. 7, an IEEE 1149.1 data scan cycle 211 is initiated by moving from the run test/idle (RT/IDLE) state 212, through the select data register scan (SELDRS) 214 and capture data register (CAPTUREDR) 216 states, and into shift data register (SHIFTDR) state 218. When moving from the CAPTUREDR state 216 into the SHIFTDR state 218, data is parallel loaded into the selected data register. While in the SHIFTDR state 218, data loaded into the data register is shifted out of the device via the TDO output 58 and into the test bus controller 44 (See FIG. 2). Data scan cycle 211 is terminated after the data has been shifted out by moving from the SHIFTDR state 218, through the EXIT 1 data register state (EXIT1DR) 219 and data register update state (UPDATEDR) 220 and into either the RT/IDLE 212 or SELDRS 214 states.

If multiple devices lie between the device loading and shifting out data and the test bus controller, the data must serially pass through all the devices between the sending device and test bus controller 44. Therefore, the SHIFTDR state 218 must be maintained for the length of time (or for the number of scan clock cycles) it takes for the data to be shifted out of the sending device, shifted through all intermediate devices, and finally shifted into the receiving device (test bus controller 44). Assuming that 8-bits are shifted out of the sending device, 100 scan bits exist between the sending and receiving device, and 8-bits are shifted into the receiving device, the number of clocks required to shift out one thousand 8-bit data packets using one thousand IEEE 1149.1 data scan cycles 211, (ignoring the clocks required to move between states) is given by the following formula:

Clocks=[8 bits (sender)+100 bits (scan path)+8 bits (Receiver)]× 1000 cycles=116,000 clocks     (8)

Since the serializer 204 can autonomously parallel load and serially shift out multiple data packets while the IEEE 1149.1 test bus is in the SHIFTDR state 218, all data from a sending device can be serially output, passed through all intermediate device scan paths, and input into the receiving device during a single data scan cycle. Using serializer 204 and the same assumptions stated above, the number of clocks required to shift one thousand 9-bit data packets during one IEEE 1149.1 scan cycle 211 is given by the following formula:

Clocks=[8 bits (Sender)×1000(Packets)]+100 bits (scan path)+8 bits (Receiver)=8,100 clocks     (9)

From these two examples, it is clear that serializer 204 significantly reduces the number of scan clocks required to access multiple digitized analog data packets when compared to the number of scan clocks required using multiple IEEE 1149.1 data scan cycles 211 to access the data packets. Using a 1 Megahertz scan clock (period=1 microsecond) the access time for the IEEE 1149.1 method and serializer method is given in equations (10) and (11) below:

IEEE 1149.1 access time=116,000 clocks×1 microsecond=116 milliseconds     (10)

Serializer access time=8,108 clocks×1 microsecond=8.1 milliseconds     (11)

Comparing the 8.1 millisecond access time using serializer 204 with the 116 milliseconds access time using the IEEE 1149.1 scan cycles 211 shows that serializer 204 can access an identical number of digitized analog data packets using only 7% of the time required by the IEEE 1149.1 scan cycle method.

Comparator Circuit

Figure 8:
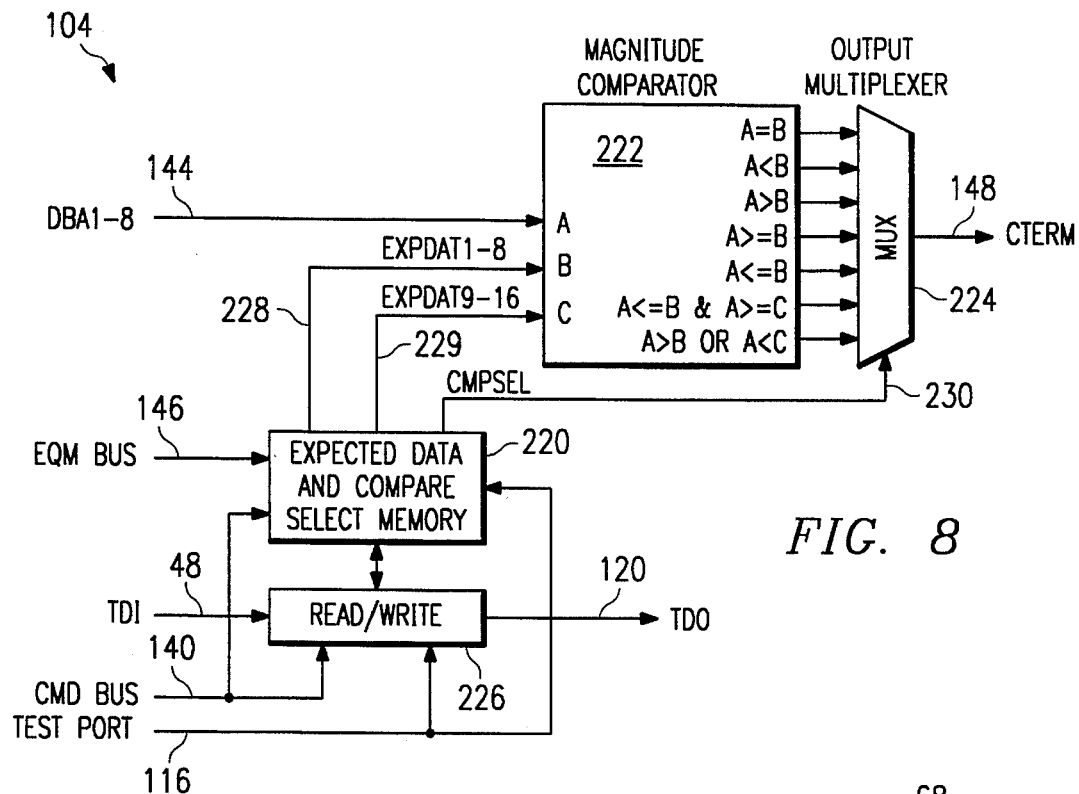
FIG. 8 illustrates the comparator circuit portion of the preferred embodiment of the present invention.

FIG. 8 shows comparator circuit 104 which compares the digitized analog data output from ADI 142 on bus DBA1-8 144 against a stored expected data value. The result of the compare is output to the EQM 68. Comparator circuit 104 consists of a read/write expected data and compare select memory 220, magnitude comparator 222, compare output multiplexer 224, and scan path 226.

Expected data and compare select memory 220 provides a means for storing expected data to compare against the digitized analog data input from ADI 142 via bus DBA1-8 144. Memory 220 also provides storage for control signals used to select which output from the magnitude comparator is input to EQM 68 via the output multiplexer 224 and CTERM signal 148. Memory 220 receives parallel data input from scan path 226, control input from test port 100 via bus 116, control input from command register 102 via command bus 140, and control input from EQM 68 via EQM bus 146. Memory 220 outputs parallel data to magnitude comparator 224 via EXPDAT1-8 bus 228 EXPDAT9-16 Bus 229, and output selection control to output multiplexer 224 via CMPSEL bus 230.

Magnitude comparator 222 compares the DBA1-8 data input 144 from ADI 142 against EXPDAT1-8 data input 228 and EXPDAT9-16 data input 229 from memory 220. Magnitude comparator 222 can indicate when the following conditions occur: DBA input 144 equals EXPDAT1-8 input 228, DBA input 144 is greater than EXPDAT1-8 input 228, DBA input 144 is less than EXPDAT1-8 input 228, DBA input 144 is equal to or greater than EXPDAT1-8 input 228, DBA input 144 is equal to or less than EXPDAT1-8 input 228, DBA input 144 is less than or equal to EXPDAT1-8 and greater 62 than or equal to EXPDAT9-16, and DBA input 144 is greater than EXPDAT1-8 or less than EXPDAT9-16. Magnitude comparator 222 receives the DBA1-8 input 144 on its A input port EXPDAT1-8 data 228 on its B input port and EXPDAT9-16 data 229 on its C input port. Magnitude comparator 224 outputs the following signals; A=B, A>B, A<B, A$\geq$B, A$\leq$B, A$\leq$B and A$\geq$C, and A>B or A<C to compare output multiplexer 224.

Compare output multiplexer 224 permits selecting one of the compare signals from the magnitude comparator 220 to be input to EQM 68. Output multiplexer 224 receives the A=B, A>B, A<B, A$\geq$B, A$\leq$B, A<=B and A>=C, and A>B or A<C signals from the magnitude comparator and compare select (CMPSEL) control signals 230 from memory 220. Output multiplexer 224 outputs the selected compare signal to EQN 68 via CTERM signal 148.

Scan path 226 serially reads and writes parallel data to and from expected data and compare select memory 20 via test port 100. Scan path 226 receives serial input from the TDI input pin 48, parallel input from memory 220, control input from command register 102 via bus 140 and control input from test port 100 via bus 116. Scan path 226 outputs serial data to TDO output 58 and parallel data to memory 220.

Before an EQM-controlled test monitoring operation begins, expected data and compare output selection control is loaded into memory 220 via scan path 226. During a scan input operation, scan path 226 and memory 220 receive control from test port 100 and command register 102 to allow data to be serially shifted into scan path 226 and then parallel loaded into memory 220.

During test, command register 102 inputs control into memory 220 via control bus 140 to enable memory 220 to respond to control input from EQM 68 via bus 146. In response to control input from EQM 68, the memory outputs EXPDAT1-8 228 and EXPDAT9-16 229 to magnitude comparator 222 and CMPSEL control 230 to output multiplexer 224. EXPDAT1-8 228 and EXPDAT9-16 229 are compared against the data input from ADI 142 on bus DBA 1-8 144 and the CMPSEL 230 couples the CTERM input 148 to the EQM 68 to one of the five selectable magnitude compare output signals from the magnitude comparator 222. Assuming that CTERM input 148 is coupled to the A=B output, of magnitude comparator 222, EQM 68 will receive a CTERM signal when DBA1-8 input 144 matches the current EXPDAT1-8 output 228. If CTERM 148 is coupled to the A<B output of magnitude comparator 222, EQM 68 will receive a CTERM signal when the DBA1-8 input value 144 is less than the EXPDAT1-8 input value 228. If CTERM 148 is coupled to the A>B output of magnitude comparator 222, EQM 68 will receive a CTERM signal when the DBA1-8 input value 144 is greater than the EXPDAT1-8 input value 228. If CTERM 148 is coupled to the A=<B output of magnitude comparator 222, EQM 68 will receive a CTERM signal when the DBA1-8 input value 144 is equal to or less than the EXPDAT1-8 input value 228. If CTERM 148 is coupled to the "A=<B and A>=C" output of magnitude comparator 222, EQM 68 will receive a CTERM signal when the DBA1-8 input value 144 lies within the window bounded on the upper end by EXPDAT1-8 data input 228 and on the lower end by EXPDAT9-16 data input 229. If CTERM 148 is coupled to the "A>B and A<C" output of magnitude comparator 222, EQM 68 will receive a CTERM signal when the DBA1-8 input value 144 lies outside the window bounded on the upper end by EXPDAT1-8 data input 228 and on the lower end by EXPDAT 9-16 data input 229. In response to a match input on the CTERM input 148, EQM 68 will input control to cause the memory 220 to output a next set of EXPDAT1-8 228, EXPDAT9-16 229 and CMPSEL 230 outputs after the current match input expires to provide the data and control for another magnitude compare operation against the data input on the DBA1-8 input bus.

Qualifier Module Circuit

FIG. 9 shows EQM circuit 68 which controls ASM circuit 40 operations that are qualified by either signal input from the internal CTERM signal 148 or from the external EQI input 70. The EQM 68 is clocked from the system clock input CLK 62 to enable the tests to operate synchronous to the system circuit being monitored. The EQM 68 consists of a test controller state machine 232, and an event multiplexer 234, EQO output multiplexer 235, a scannable operation code (OPCODE) register 236, a scannable loop counter 238, a scannable event counter 240, and a read/write event count memory 242.

Test controller 232 internally controls test circuits (TCR 112 and memory 110) inside ASM circuit 40 to compress and/or store digitized analog data input from ADI 142 in response to event inputs from either the CTERM 148 or EQI 70 signals. Test controller 232 receives an EVENT input 244 from event multiplexer 234, an external system clock input from the CLK pin 62, and enable (ENA) from command register bus 140, a test OPCODE input 246 from OPCODE register 236, a loop count minimum (LCMIN) input 248 from the scannable loop counter 238, and an event count minimum (ECMIN) input 250 from scannable event counter 240. Test controller 232 outputs control 146 to loop counter 238, event counter 240, event count memory 242, comparator 104, TCR 112, and memory 110 via control bus 146.

Event multiplexer 234 permits a selection of either internal CTERM signal 148 or external EQI signal 70 as input to test controller 232. Event multiplexer 234 receives CTERM signal 148 from comparator 104, the EQI signal from the EQI pin 70, and control input from scannable OPCODE register 236. Event multiplexer 234 outputs an event signal 244 to test controller 232.

EQO multiplexer 235 permits a selection of either the CTERM 148 or STATUS information 257 from the test controller on control bus 148 to be output from the EQM 68 and ASM 40. EQO multiplexer 235 receives the CTERM signal from comparator 104 and STATUS 257 and SELECT 146 signals from test controller 232, and outputs the EQO signal from the EQM 68 and ASM 40. The EQO multiplexer 235 is selected to output the CTERM 148 signal whenever a need exists to trigger an external circuit using the internal CTERM signal matching capabilities. When the ASM 40 is operating with other circuits that contain EQMs 68, the CTERMs 148 of multiple EQMs can be globally combined external to each input, to serve as a global qualification signal. The EQO multiplexer 235 is selected to output STATUS signals 257 whenever a need exists to monitor the internal state of the EQM by an external controller or when a need exists to use a status signal output for controlling or gating an external circuit on and off. Test controller 232 status that can be output from the EQO multiplexer includes: Test Running, End of Test, and Idle.

Scannable OPCODE register 236 stores a test OPCODE that controls the operation of test controller 232 and selects EQI input 70 or CTERM input 148 to be the event input to test controller 232. OPCODE 236 register receives serial input from TDI pin 48, control input from the test port bus 116, and control input from command register bus 140. OPCODE register 236 outputs test OPCODE 246 to test controller 232, selection control to event multiplexer 234, and serial data to scannable loop counter 238.

The scannable loop counter 238 repeats a test OPCODE input from OPCODE register 236 to test controller 232 a specified number of times. Loop counter 238 may be serially loaded with a count specifying the number of times a test OPCODE is to be repeated. The loop counter 238 receives serial input from scannable OPCODE register 236, a decrement loop count (DECLC) signal 254 from test controller 232, control input from test port bus 116, and control input from command register bus 140. Loop counter 238 outputs serial data to scannable event counter 240 and a loop count minimum (LPCMIN) signal 248 to test controller 232.

Scannable event counter 240 detects the nth occurrence of a particular event input. The event counter 240 may be reloaded from the event count memory 242 multiple times, allowing it to perform multiple count operations during EQM test operations. In some test monitoring operations it may be necessary to delay a test action (i.e. at test start, test pause, test stop) until a 2nd, 3rd, . . . or nth occurrence of the event input. The event counter 240 may be loaded with a count either serially from the test port or in parallel from the event count memory 242, specifying the number of event inputs that must occur before the test controller 232 reacts to an event input to execute a test OPCODE.

In addition to counting events, event counter 240 may be used in some EQM test operations to count clock inputs. For example, some EQM test operations use event counter 240 to perform test actions (i.e. delay test, do test, pause test) for a number of clock (CLK) cycles. During these test operations event counter 240 performs test actions for a predetermined number of clock cycles. Event counter 240 receives serial input from loop counter 238, decrement event count (DECEC) 256 and load count (LDCNT) 258 signals from test controller 232, parallel data input from event count memory 242, control input from test port bus 116, and control input from command register bus 140. Event counter 240 outputs serial data to the ASM 40 TDO pin 58, an event count minimum (ECMIN) signal 250 to the test controller 232, and parallel data to event count memory 242.

Event count memory 242 stores a plurality of event counts that can be loaded into event counter 240 to achieve a plurality of event or clock counting operations. The scannable event counter 240 serially reads and writes parallel data to and from event count memory 242 via test port 100. During test and after a current event count has reached a minimum value, test controller 232 outputs control to cause event count memory 242 to output a new count value to event counter 240 and control to cause event counter 240 to load the new count value from event memory 242 so that another event count operation may be performed. The event count memory 242 receives control input from command register bus 140, control input from test port 100 via bus 116, a next count (NXTCNT) signal 260 from test controller 232, and parallel data input from the scannable event counter 240. The event count memory;242 outputs parallel data to the scannable event counter 240.

Before an EQM controlled operation begins, OPCODE 236, LOOP COUNT 238 and event count 240 must be scanned in via test port 100. During a scan input operation, OPCODE 236, LOOP COUNT 238, and EVENT COUNT 240 scan path is accessed multiple times to load data into the EVENT COUNT MEMORY 242. During event count memory 242 load operations, the scan path and memory receive control from test port 100 to allow data to be serially shifted into event counter 240 of the scan path and then parallel loaded into memory 110.

After the scan path sections and memory 242 have been loaded, a command is scanned into command register 102 (FIG. 3) causing command register 102 to output an enable (ENA) signal to test controller 232. After test controller 232 receives the ENA signal, it reads the OPCODE input from OPCODE register 236 to determine the type of test operation to perform. EQM 68 can perform 10 types of test operations or protocols. Aforementioned documents TI-15423 and TI-15433 describe these test protocols in detail. Moreover, Table 1 provides a pseudo-code description of each EQM 68 test protocol.

TABLE 1

EOM TEST PROTOCOLS

Note 1: M = EQM loop count, and N = EQM event count.
Note 2: The word "test" refers to a PSA, sample, or store operation.

Protocol 1 →   For M times do
                Begin
                    on Nth event do test
                End
                End of test
Protocol 2 →   For M times do
                Begin
                    During Nth event do test
                End
                End of Test
Protocol 3 →   For M times do
                Begin
                    on Nth event do test
                    on Nth event stop test
                End
                End of test
Protocol 4 →   For M times do
                Begin
                    On Nth event start test after N clocks
                    On Nth event stop test
                End
                End of Test
Protocol 5 →   For M times do
                Begin
                    On Nth event start test
                    On Nth event stop test after N clocks
                End
                End of test
Protocol 6 →   For M times do
                Begin
                    On Nth event start test after N clocks
                    On Nth event stop test after N clocks
                End
                End of Test
Protocol 7 →   For M times do TABLE 1-continued

EOM TEST PROTOCOLS

Begin
                    On Nth event do test for N clocks
                End
                End of test
Protocol 8 →   For M times do
                Begin
                  On Nth event
                    Delay test for N clocks
                    Do test for N clocks
                End
                End of Test
Protocol 9 →   On Nth event do
                Do test for N clocks
                Then for (M-1) times do
                  Pause for N clocks
                  Do test for N clocks
                End
                End of Test
Protocol 10 →   On Nth event, for M times do
                Begin
                    Delay test for N clocks
                    Do test for N clocks
                End
                End of Test During an EQM controlled test operation, test controller 232 monitors the event input from a signal input to initiate the test. The event input comes either from the CTERM input 148 from comparator 104 from the EQI input pin 70 via event multiplexer 234. In response to an event input, test controller 232 starts executing one of the test protocols listed in Table 1. During test execution, test controller 232 outputs control via bus 146 to TCR 112, memory 110, comparator 104, loop counter 238, event counter 240, and event count memory 242 to perform the test operation.

Description of Operation

The following is a description of how ASM 40 of the preferred embodiment operates when one of its instructions has been scanned into command register 102. In the instructions, the prefix EC refers to test operations that operate from External Control output from test port 100, and the prefix IC refers to test operations that operate from Internal Control output from EQM 68. The terms V1 and V2 in the instructions refer to two of the analog signal inputs ASI-1 through ASI-n. Signal V1 is the selected output from ADI multiplexer 1 156 and signal V2 is the selected output from ADI multiplexer 2 158 (See FIG. 4). Selection control for signals V1 and V2 are input to ADI 142 from control register 114. When an instruction is shifted into command register 102, command register outputs control via control bus 140 to either enable a test operation or perform a scan operation through one of the data register scan paths: 104, 106, 68 ,110, 112, or 114.

EC SAMPLE V1: Externally. Controlled Sample of Analog Signal V1

During this test instruction, TCR 112 receives control from the external test bus via test port 100 and control bus 116 to CAPTURE the digitized analog data output from ADI 142 during CAPTUREDR State 216. The data captured is a digital representation of a voltage input on one of the selectable inputs 1-n. After the data is captured, it is shifted out of TCR 112 and ASM 40 via TDO 58 for inspection during SHIFTDR state 218.

IC SAMPLE V1: Internally Controlled Sample of Analog Signal V1

During this test instruction, TCR 112 receives control from internal EQM 68 via EQM control bus 146 to capture the digitized analog data output from the ADI 142. The data captured is a digital representation of the voltage input on one of the selectable analog inputs 1-n. After the data is captured, it can be shifted out of TCR 112 for inspection via a Read TCR instruction.

EC SAMPLE V1–V2: Externally Controlled Sample of the Difference Between Analog Signals V1 and V2

During this inspection, TCR 112 receives control from the external test bus via test port 100 and control bus 116 to capture the digitized analog data output from ADI 142 during CAPTUREDR state 216. The data captured is a digital representation of the voltage difference between selected analog signals V1 and V2. After the data is captured, it is shifted out of TCR 112 and ASM 40 via TDO 58 for inspection during SHIFTDR state 218.

IC SAMPLE V1–V2: Internal Controlled Sample of the Difference between Analog Signals V1 and V2

During this test instruction, TCR 112 receives control from the EQM 68 via EQM control bus 146 to capture the digitized analog data output from ADI 142. The data captured is a digital representation of the voltage difference between analog signals V1 and V2. After the data is captured, it can be shifted out of TCR 112 for inspection via a Read TCR instruction.

EC PSA V1: Externally Controlled PSA of Analog Signal V1

During this parallel signature analysis (PSA) test instruction, TCR 112 receives control from the external test bus via test port 100 and control bus 161 to compress the digitized data output from ADI 142 during RI/IDLE state 212. The data compressed is a digital representation of the voltage input on one of the selectable analog inputs 1-n over a period of time. After the data is compressed, it can be shifted out of TCR 112 for inspection via a Read TCR instruction.

IC PSA V1: Internally controlled PSA of Analog Signal V1

During this PSA test instruction, TCR 112 receives control from EQM 68 via EQM control bus 146 to compress the digitized analog data output from the ADI 142. The data compressed is a digital representation of the voltage input of one of the selectable analog inputs 1 through n over a period of time. After the data is compressed, it can be shifted out of TCR 112 for inspection via a Read TCR instruction.

EC PSA V1–V2: Externally Controlled PSA of the Difference Between Analog Signal V1 and V2

During this PSA test instruction, TCR 112 receives control from the external test bus via test port 100 and control bus 116 to compress the digitized analog data output from ADI 142 during RT/IDLE state 212. The data compressed is a digital representation of the voltage difference between analog signals V1 and V2 over a period of time. After the data is compressed, it can be shifted out of TCR 112 for inspection via a Read TCR instruction.

IC PSA V1–V2: Internally Controlled PSA of the Difference Between Analog Signal V1 and V2

During this PSA test instruction, TSR 112 receives control from the EQM 68 via EQM control bus 146 to compress the digitized analog data output from ADI 142. The data compressed is a digital representation of the voltage difference between the analog signals V1 and V2 over a period of time. After the data is compressed, it can be shifted out of TCR 112 for inspection via a Read TCR instruction.

EC STORE V1: Externally Controlled Storage of the Analog Signal V1

During this test instruction, the memory 110 receives control from the external test bus via test port 100 and control bus 116 to store the digitized analog data output from ADI 142 during RT/IDEL state 212. The data stored is a digital representation of the voltage input on one of the selectable inputs 1 through n over a period of time. After the data has been stored, the memory contents can be shifted out for inspection via a Read memory instruction.

IC STORE V1: Internally Controlled Storage of Analog Signal V1

During this test instruction, memory 110 receives control from the EQM 68 via EQM control bus 46 to store the digitized analog data output from ADI 142. The data stored is a digital representation of the voltage input on one of the selectable analog inputs 1 through n over a period of time. After the data has been stored, memory 110 contents may be shifted out for inspection via a Read memory instruction.

EC STORE V1–V2: Externally Controlled Storage of the Difference between Analog Signals V1 and V2

During this test instruction, memory 110 receives control from the external test bus via test port 100 and control bus 116 to store the digitized analog data output from ADI 142 during RT/IDLE state 212. The data stored is a digital representation of the voltage between analog signals V1 and V2 over a period of time. After the data has been stored, memory 110 contents may be shifted out for inspection via a Read Memory instruction.

IC STORE V1–V2: Internally Controlled Storage of the Difference Between Analog Signals V1 and V2

During this test instruction, the memory 112 receives control from EQM 68 via EQM control bus 146 to store the digitized analog data output from ADI 142. The data stored is a digital representation of the voltage difference between analog signal V1 and V2 over a period of time. After the data has been stored, the memory contents can be shifted out for inspection via a Read Memory instruction.

EC PSA/STORE V1: Externally Controlled PSA and Storage of the Analog Signal V1

During this test instruction, TCR 112 and memory 110 will receive control from the external test bus via test port 100 and control bus 116 to compress and store, respectively, the digitized analog data output from ADI 142 during RT/IDLE state 212. The data compressed and stored is a digital representation of the voltage input on one of the selectable analog inputs 1 through n over a period of time. After the data has been compressed into TCR 112 and stored into the memory 110, it can be shifted out for inspection by executing a Read TCR instruction to access the signature in TCR 112, followed by a Read Memory instruction to access the memory 110 contents.

IC PSA/STORE V1: Internally Controlled PSA and Storage Analog Signal V1

During this test instruction, TCR 112 and memory 110 receive control from EQM 68 via EQM control bus 146 to compress and store, respectively, the digitized analog data output from ADI 142. The data compressed and stored is a digital representation of the voltage input on one of the selectable analog inputs 1-n over a period of time. After the data has been compressed into the TCR 112 and stored into memory 110, it may be shifted out for inspection by executing a Read TCR instruction to access the signature in TCR 112, followed by a Read memory instruction to access the memory contents.

EC PSA/STORE V1–V2: Internally Controlled PSA and Storage of the Difference Between Analog Signals V1 and V2

During this test instruction, TCR 112 and memory 110 receive control from external test bus via test port 100 and control bus 116 to compress and store, respectively, the digitized analog data output from ADI 142 during RT/IDLE state 212. The data compressed and stored is a digital representation of the voltage difference between analog signals V1 and V2 over a period of time. After the data has been compressed into the TCR 112 and stored into memory 110, it may be shifted out for inspection by executing a Read TCR instruction to access the signature in TCR 112, followed by a Read memory instruction to access the memory 110 contents.

IC PSA/STORE V1–V2: Internally Controlled PSA and Storage of the Difference Between Analog Signals V1 and V2

During this test instruction, TCR 112 and memory 110 receive control from EQM 68 via EQM control bus 146 to compress and store, respectively, the digitized analog data output from ADI 142. The data compressed and stored is a digital representation of the voltage difference between analog signals V1 and V2 over a period of time. After the data has been compressed into the TCR 112 and stored into memory 110, it may be shifted out for inspection by executing a Read TCR instruction to access the signature in TCR 112, followed by a Read memory instruction to access the memory 110 contents.

Serialize TCR: During the serialize TCR instruction, TCR 112 receives control from the serializer 204 and test port 100 to repetitively parallel load and shift out digitized analog voltage measurements from ASM 40 via TDO output 58, during SHIFTDR state 218.

Read TCR: During the read TCR instruction, the TCR 112 receives control from the external test bus via test port 100 to shift out the current data value in TCR 112 from the ASM 40 TDO output pin 58 during SHIFTDR state 218. This instruction is used to access the signature stored in TCR 112 from a previous analog PSA instruction. During this instruction, the CAPTUREDR state 216 is disabled to allow the existing value in TCR 112 to be shifted out.

Scan EQM: During the scan EQM instruction, EQM 68 receives control from the external test bus via the test port 100 to shift data from TDI input 48, through the EQM 68 scan path to TDO output 58. This instruction is used to load control information into the EQM controller 68 so that an event qualified test monitor operation may be executed.

Scan Control Register: During the scan control register instruction, control register 114 receives control from the external test bus via the test port 100 to shift data from TDI input 48, through the control register scan path, to TDO output 58. This instruction is used to load control information into the control register to setup ADI 142 for an analog test operation.

Scan Bypass Register: During the scan bypass register instruction, the bypass register 106 receives control from the external test bus via test port 100 to shift data from TDI input 48, through the bypass scan cell, and out of the ASM 40 via the TDO output pin 58. This instruction is used to shorten the scan path through ASM 40 to only a single scan cell or flip flop.

Write Comparator Memory: During the write comparator memory instruction, comparator 104 receives control from the external test bus via test port 100 and control bus 116 to accept serial data input to ASM 40 from TDI pin 48, convert the data into a parallel data format, then write the data into the comparators expected data and compare select memory 220.

Read Comparator Memory: During the read comparator memory instruction, comparator 104 receives control from the external test bus via test port 100 to convert the parallel data output from the expected data and compare select memory into a serial format, then shift the serial data out of the ASM 40 via TDO output 58.

Write Storage Memory: During the write storage memory instruction, memory 110 receives control from the external test bus via test port 100 to accept serial data input to ASM 40 from TDI input pin 58, converted it into a parallel data format, then write the data into the storage memory.

Read Storage Memory: During the read storage memory, memory buffer 110 receives control from the external test bus via the test port 100 to convert the parallel data output from the storage memory 110 into a serial format, then shift the serial data out of ASM 40 via the TDO output 58.

Figure 11:
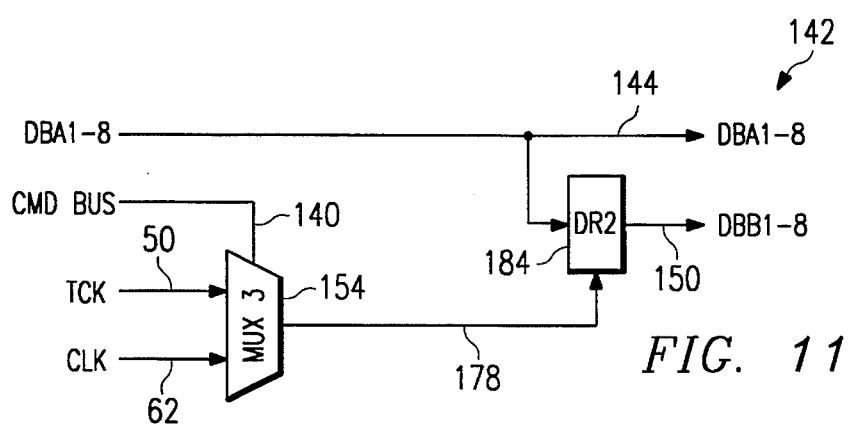
FIGS. 10 and 11 illustrate alternative embodiments of the present invention.
Figure 10:
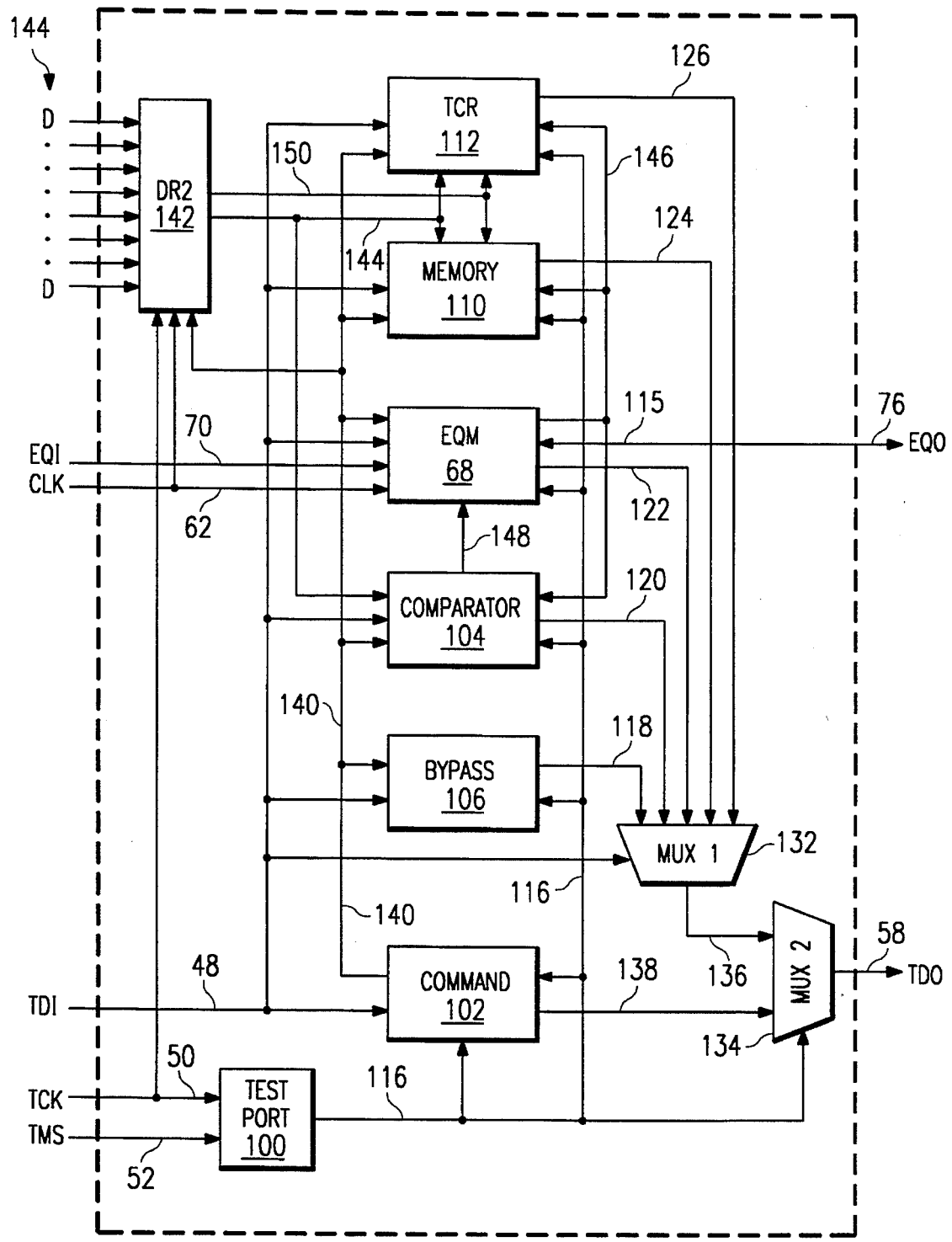

It is seen in FIG. 10 that converting the ASM architecture to monitor digital inputs is easily accomplished by extracting all circuitry in ADI 142 except for DR2 (see FIG. 11). Also the need for control register 114 is no longer necessary. The operation and purpose of DR2 142 is the same as described previously. DR2 142 receives digital signal inputs DBA1-8 144 and clocking control 178 from multiplexer 154. DR2 outputs data on DBB1-8 150 to TCR 112 and memory 110. DBA1-8 144 is input to TCR 112, memory 110, and comparator 104.

A digital bus monitor circuit has been previously described in aforementioned document TI-14124. However, document TI-14124 can only qualify a test data store and/or compression operation in response to a received digital input pattern being exactly equal to an internally stored expected digital pattern.

The preferred embodiment, modified as shown in FIGS. 10 and 11, allows a test operation to be controlled in response to a received digital input pattern being: (1) equal to a stored expected value, (2) greater than a stored expected value, (3) greater than or equal to a stored expected value, (4) less than a stored expected value, (5) less than or equal to a stored expected value, (6) less than or equal to one stored expected value and greater than or equal to another stored expected value (i.e. within a window bounded by two digital number values), or (7) either greater than one stored expected value or less than another stored expected value (i.e. outside of a window bounded by two digital number values).

This expanded qualification capability improves the ability for a digital signal monitoring circuit to qualify test operations. Using the digital monitoring circuit of the present invention, it is possible to qualify a data store and/or compression operation in response to a processor's address bus being within a certain address range instead of only at a particular address location.

For example, the embodiment of FIGS. 10 and 11 can qualify a test in response to a received digital address being greater than a stored expected address. Another example of the improvement that this embodiment affords is the ability to qualify a test in response to a received digital address being greater than or equal to a stored expected address. Yet another example of an improvement that this embodiment affords is the ability to qualify a test in response to a received digital address being less than a stored expected address. A further example improvement that this embodiment affords is the ability to qualify a test in response to a received digital address being less than or equal to a stored expected address. Another example of the improvement that this embodiment affords is the ability to qualify a test in response to a received digital address input being inside an address window bounded by stored expected upper and lower address limits. One more example improvement of this embodiment is the ability to qualify a test in response to a received digital address input being outside an address window bounded by stored expected upper and lower address limits.

While the present invention has been described as being a package test integrated circuit that can be addressed to a board design comprising other packaged functional integrated circuits, it should be understood that it could also be an unpackaged test integrated circuit (die) mounted on a common substrate comprising other unpackaged functional integrated circuits (die), or it could be a testing subcircuit in an integrated circuit comprising other functional subcircuits.

Although the preferred embodiment has been described in detail, it should be understood that various changes, substitutions and alterations can be made herein without departing form the spirit and scope of the invention as defined in the appended claims.

What is claimed is:

1. An analog signal monitoring circuit for non-intrusively monitoring electronic circuitry including an analog circuit, comprising:

input circuitry for receiving a plurality of analog signal inputs from the analog circuit; and test circuitry associated with said input circuitry for, while the electronic circuitry operates under timing control of a first clock, processing said analog signal inputs in response to predetermined conditions and synchronously with either one of said first clock and a second clock, said test circuitry including translation circuitry associated with said input circuitry for converting said analog signal inputs into digital signal representations of said analog signal inputs, output circuitry associated with said translation circuitry for outputting said digital signal representations, control circuitry for controlling said translation and said output circuitry to operate while said analog circuit is in a functioning mode, and event qualification circuitry connected to said output circuitry for indicating the occurrence of said predetermined conditions and controlling said test circuitry in response to said predetermined conditions.

2. The analog signal monitoring circuit of claim 1, wherein said test circuitry comprises circuitry for storing said analog signal inputs.

3. The analog signal monitoring circuit of claim 1, wherein said test circuitry comprises circuitry for compressing said digital signal representations.

4. The analog signal monitoring circuit of claim 1, wherein said test circuitry comprises circuitry for storing and compressing said digital signal representations.

5. The analog signal monitoring circuit of claim 1, wherein said test circuitry further comprises memory circuitry for storing said digital signal representations and wherein said output circuitry associates with said memory circuitry for outputting said stored digital signal representations and said control circuitry further controls said memory circuitry to operate while said analog circuit is in a functioning mode.

6. The analog signal monitoring circuit of claim 1, wherein said test circuitry further comprises parallel signature analysis circuitry associated with said translation circuitry for compressing a plurality of said digital representations into a signature, wherein said output circuitry is associated with said parallel signature analysis circuitry to output said signature, and said control circuitry associates with said parallel signature analysis circuitry to control said compressing of said digital signal representations.

7. The analog signal monitoring circuit of claim 1, wherein said test circuits further comprises difference circuitry for measuring voltage differences between a plurality of received analog signal inputs, and wherein said translation circuitry associates with said difference circuitry to convert said voltage difference measurements into a plurality of digital signal representations, and said control circuitry further controls said difference circuitry to operate while said analog circuit is in functioning mode.

8. The analog signal monitoring circuit of claim 1, wherein said test circuitry further comprises an expected data memory for storing a plurality of expected digital representations associated with said predetermined conditions.

9. The analog signal monitoring circuit of claim 1, wherein said test circuitry is operable to compare expected digital signal representations with said digital signal representations received from the analog circuit and is operable to indicate whether said received representations match said expected digital signal representations.

10. The analog signal monitoring circuit of claim 1, further comprising circuitry for associating said analog signal monitoring circuit with an external test controller which provides said second clock.

11. The analog signal monitoring circuit of claim 1, further comprising circuitry associated with said event qualification circuitry for operating said analog signal monitoring circuit synchronous to said event qualification circuitry.

12. The analog signal monitoring circuit of claim 1, further comprising a plurality of test protocols associated with said event qualification circuitry for programmably actuating said event qualification circuitry in response to a plurality of matched signals.

13. The analog signal monitoring circuit of claim 12, wherein said test protocols comprise testing whether said analog signal inputs are at most a first expected value and at least a second expected value.

14. The analog signal monitoring circuit of claim 12, wherein said test protocols comprise testing whether said analog signal inputs are greater than a first expected value or, alternatively, less than a second expected value.

15. The analog signal monitoring circuit of claim 2, wherein said test protocols adjustably control the duration of test operations performed by said analog signal monitoring circuit.

16. The analog signal monitoring circuit of claim 1, further comprising a plurality of protocols for adjustably and programmably controlling the actuation of said event qualification circuitry.

17. The analog signal monitoring circuit of claim 1, packaged as a separate integrated circuit board.

18. The analog signal monitoring circuit of claim 1, mounted as an integrated circuit on a common substrate with at least one analog functional integrated circuit.

19. The analog signal monitoring circuit of claim 1, provided as a subcircuit within a larger integrated circuit.

20. The analog signal monitoring circuit of claim 1, wherein said test circuitry is operable to compare expected digital signal representations with said digital signal representations received from said analog circuit and is operable to indicate whether said received representations have values no less than said expected digital representations.

21. The analog signal monitoring circuit of claim 1, wherein said test circuitry is operable to compare expected digital signal representations with said digital signal representations received from said analog circuit and is operable to indicate whether said received representations are no greater than said expected digital signal representations.

22. The analog signal monitoring circuit of claim 1, wherein said test circuitry is operable to compare expected digital signal representations with said digital signal representations received from said analog circuit and is operable to indicate whether said received representations are less than said expected digital signal representations.

23. The analog signal monitoring circuit of claim 1, wherein said test circuitry is operable to compare expected digital signal representations with said digital signal representations received from said analog circuit and is operable to indicate whether said received representations are greater than said expected digital signal representations.

\* \* \* \* \*